US012133348B2

(12) United States Patent
Cho

(10) Patent No.: US 12,133,348 B2
(45) Date of Patent: Oct. 29, 2024

(54) ELECTRONIC DEVICE INCLUDING WATERPROOF STRUCTURE

(71) Applicant: Samsung Electronics Co., Ltd., Gyeonggi-do (KR)

(72) Inventor: Sunggun Cho, Gyeonggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 272 days.

(21) Appl. No.: 17/729,093

(22) Filed: Apr. 26, 2022

(65) Prior Publication Data
US 2022/0386491 A1 Dec. 1, 2022

Related U.S. Application Data

(63) Continuation of application No. PCT/KR2022/005701, filed on Apr. 21, 2022.

(30) Foreign Application Priority Data

May 27, 2021 (KR) ......................... 10-2021-0068114

(51) Int. Cl.
*H05K 5/06* (2006.01)
*H04M 1/02* (2006.01)
(Continued)

(52) U.S. Cl.
CPC .......... *H05K 5/062* (2013.01); *H04M 1/0216* (2013.01); *H05K 5/0017* (2013.01); *H05K 5/0226* (2013.01); *H05K 5/03* (2013.01)

(58) Field of Classification Search
CPC .... G06F 1/1652; G06F 1/1656; G06F 1/1681; G06F 1/16; G06F 1/1616; H05K 5/0226;
(Continued)

(56) References Cited

U.S. PATENT DOCUMENTS 9,759,979 B2  9/2017 Wu et al.
10,512,184 B2  12/2019 Cho et al.
(Continued)

FOREIGN PATENT DOCUMENTS

EP        3809400 A1     4/2021
JP     2012-79729 A      4/2012
(Continued)

OTHER PUBLICATIONS

International Search Report dated Aug. 1, 2022.
Written Opinion dated Aug. 1, 2022.
Extended European Search Report dated Jun. 25, 2024.

*Primary Examiner* — Sagar Shrestha
(74) *Attorney, Agent, or Firm* — Cha & Reiter, LLC

(57) ABSTRACT

According to certain embodiments, an electronic device may include a first housing, a second housing including at least one through-hole and connected to the first housing through a hinge device, a display panel disposed to be supported by the first housing and the second housing, a bending part extending outward from the display panel and including a control circuit, a cover member disposed on at least a portion of the bending part so as to cover at least a part of the control circuit and including a conductive layer, a first waterproof member disposed between the display panel and the first housing so as to surround at least a portion of the bending part, a second waterproof member disposed between the bending part and the first housing, and a third waterproof member filled through the through-hole such that the first waterproof member is connected to the second waterproof member, wherein the cover member includes an exposed part in which at least a part of the conductive layer is exposed, and the exposed part is disposed to at least partially overlap the through-hole.

20 Claims, 27 Drawing Sheets

(51) Int. Cl.
  *H05K 5/00* (2006.01)
  *H05K 5/02* (2006.01)
  *H05K 5/03* (2006.01)
(58) Field of Classification Search
  CPC ........ H05K 5/062; H05K 5/0017; H05K 5/03; H05K 5/00; H05K 5/06; H05K 5/061; H04M 1/0216; H04M 1/02; H04M 1/0202; H04M 1/0268; H04M 1/0277
  See application file for complete search history.

(56) References Cited

U.S. PATENT DOCUMENTS

| | | | |
|---|---|---|---|
| 11,191,177 | B2 | 11/2021 | Choi et al. |
| 2012/0081875 | A1 | 4/2012 | Yamaguchi et al. |
| 2017/0099742 | A1* | 4/2017 | Choi ..................... H05K 5/069 |
| 2018/0033571 | A1* | 2/2018 | Choi ..................... G06F 1/1671 |
| 2018/0076412 | A1 | 3/2018 | Kim et al. |
| 2018/0310426 | A1* | 10/2018 | Cho ..................... H04M 1/0266 |
| 2019/0006615 | A1* | 1/2019 | Jung ..................... H10K 59/87 |
| 2019/0072997 | A1* | 3/2019 | Cha ..................... G06F 1/1643 |
| 2019/0254129 | A1* | 8/2019 | Cho ..................... H10K 59/8722 |
| 2020/0162596 | A1* | 5/2020 | Kim ..................... H05K 1/0393 |
| 2020/0196496 | A1 | 6/2020 | Shin |
| 2020/0319672 | A1* | 10/2020 | Kim ..................... G06F 1/1656 |
| 2020/0348725 | A1* | 11/2020 | Kim ..................... H05K 5/0217 |
| 2020/0413559 | A1* | 12/2020 | Lee ..................... H05K 5/062 |
| 2021/0267073 | A1 | 8/2021 | Fan |
| 2022/0386491 | A1* | 12/2022 | Cho ..................... H05K 5/0226 |

FOREIGN PATENT DOCUMENTS

| | | |
|---|---|---|
| KR | 10-2018-0029190 A | 3/2018 |
| KR | 10-2018-0118332 A | 10/2018 |
| KR | 10-2020-0057236 A | 5/2020 |
| KR | 10-2020-0073086 A | 6/2020 |
| KR | 10-2021-0001050 A | 1/2021 |

* cited by examiner

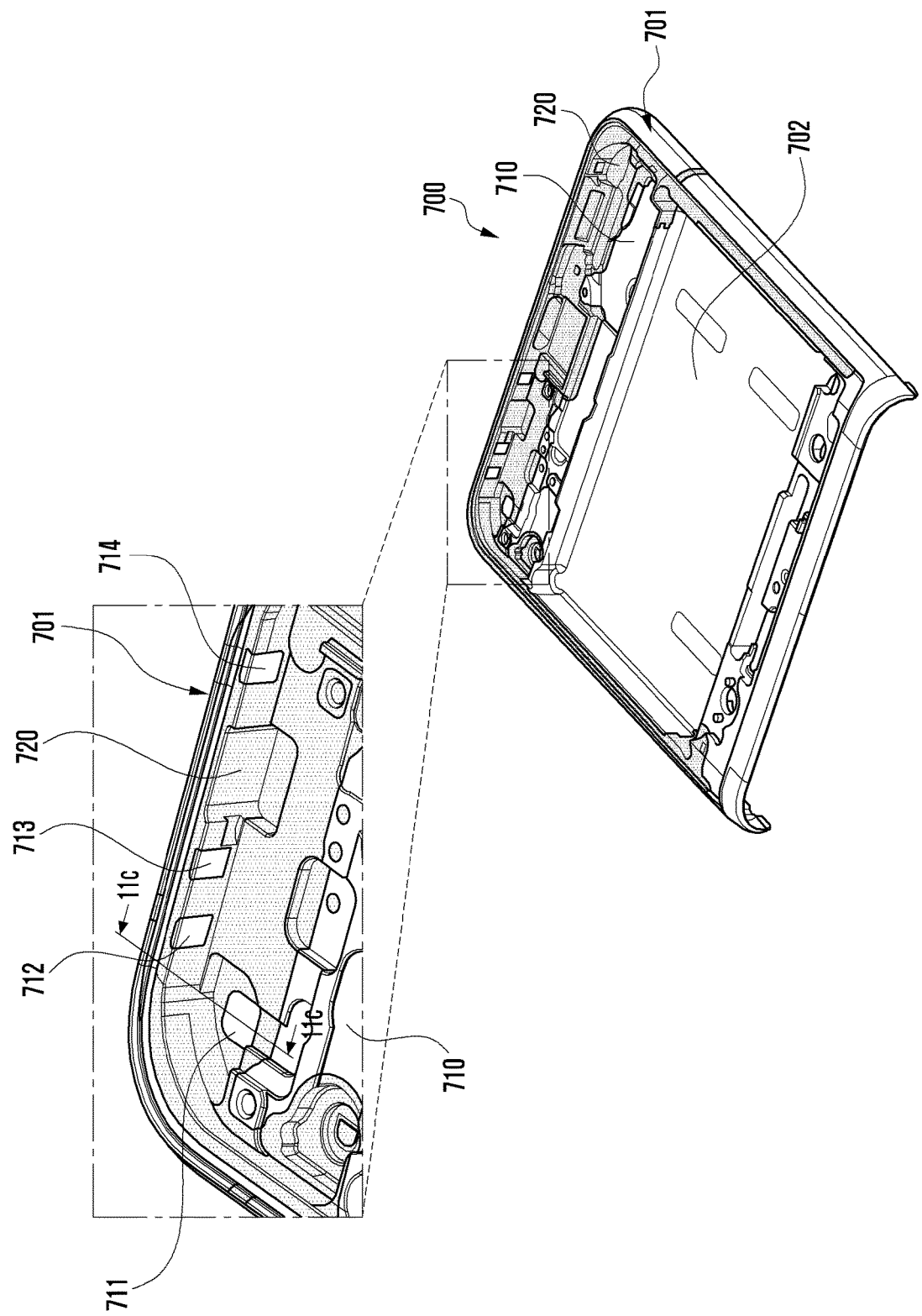

ELECTRONIC DEVICE INCLUDING WATERPROOF STRUCTURE

CROSS-REFERENCE TO RELATED APPLICATION(S)

This application is a continuation of International Application No. PCT/KR2022/005701, filed on Apr. 21, 2022, which claims priority to Korean Patent Application No. 10-2021-0068114, filed on May 27, 2021 in the Korean Intellectual Property Office, the disclosures of which are herein incorporated by reference.

TECHNICAL FIELD

The present disclosure relates to an electronic device including a waterproof structure.

BACKGROUND

Electronic devices have becoming slimmer and more rigid with improved design features and more useful and functional elements. Most electronic devices now have waterproof and/or dustproof structures to prevent external moisture and/or foreign materials from damaging internal electronic components.

An electronic device may include a display (for example, flexible display), which may include a display panel disposed beneath a window layer and at least functional member disposed beneath the display panel. The display may include a bending portion extending from an edge of the display panel so as to fold onto the back surface of the display panel. For example, when the display is provided on an electronic device, the bending portion may appear, from a top view, protruding outwards from an edge of the display panel and then to fold onto the back surface. The bending portion may include an extension portion extending from the display panel and including a control circuit, and a flexible substrate (for example, flexible printed circuit board (FPCB)) with multiple electric elements, electrically connected to the extension portion and electrically connected to the substrate (for example, main substrate or device substrate) of the electronic device.

An electronic device may include at least one waterproof member (for example, waterproof tape) disposed between the back surface of the display and the housing for waterproofing and/or dustproofing functions. Such a waterproof member may be disposed to substantially surround the internal electronic components. If the display is attached to the housing through the waterproof member, the part folded onto the back surface of the display panel and the remaining part have different heights, thus a discontinuous section may occur. Such a discontinuous section causes the waterproof member to detach therefrom. The discontinuous section may be connected by injecting a liquid-state or semi-solid-state waterproof member by using a dispenser through a through-hole formed in the housing in a corresponding position, thereby filling the same. In such a case, the waterproof member may be applied, through an automatic process or a manual process, by partially inserting a needle of the dispenser into the through-hole from the opposite surface of the surface of the housing, on which the display is disposed, and then injecting the same. Thereafter, it may be solidified through natural curing, chemical curing, or physical curing.

The needle partially inserted into the through-hole needs to be inserted into the through-hole to an appropriate extent of insertion, but if excessively inserted as a result of an erroneous operation, may contact the bending portion, which is a part of the display panel, thereby fracturing the display panel. In the case of an automatic process where there is absence for detecting such erroneous operations, a large amount of defective products may be produced, thereby degrading the productivity.

SUMMARY

Certain embodiments of the disclosure may provide an electronic device including a waterproof structure.

Certain embodiments of the disclosure may provide an electronic device including a structure capable of preventing fracture of a display panel during a waterproof member injecting operation.

Certain embodiments of the disclosure may provide an electronic device capable of contributing to productivity improvement by providing a structure for instantly detecting an erroneous operation of a needle during a waterproof member injecting operation.

Problems to be solved by the disclosure are not limited to the above-mentioned problems, and may be variously expanded without deviating from the idea and scope of the disclosure.

According to Certain embodiments, an electronic device may include a first housing including a first support member, a second housing including a second support member having at least one through-hole, a hinge device configured to foldably connect the first housing to the second housing, a flexible display disposed to be supported by the second housing via the hinge device from the first housing, the flexible display including a window layer, a display panel disposed beneath the window layer, and a bending part extending from the display panel and attached to a rear surface of the display panel, the bending part including an extension part extending outward from the display panel and including a control circuit, and a cover member disposed on at least a portion of the extension part so as to cover at least a part of the control circuit and including a conductive layer, a first waterproof member disposed between the display panel and the first support member so as to surround at least a portion of the bending part, a second waterproof member disposed between the bending part and the first support member, and a third waterproof member filled through the through-hole such that the first waterproof member is connected to the second waterproof member, wherein the cover member includes an exposed part in which at least a part of the conductive layer is exposed, and the exposed part is disposed to at least partially overlap the through-hole.

According to Certain embodiments, an electronic device may include a housing including a first support member having at least one through-hole, a display disposed to be supported by at least a part of the housing, the display including a window layer, a display panel disposed beneath the window layer, and a bending part extending from the display panel and attached to a rear surface of the display panel, the bending part including an extension part extending outward from the display panel and including a control circuit, and a cover member disposed on at least a portion of the extension part so as to cover at least a part of the control circuit and including a conductive layer, a first waterproof member disposed between the display panel and the first support member so as to surround at least a portion of the bending part, a second waterproof member disposed between the bending part and the first support member, and a third waterproof member filled through the through-hole such that the first waterproof member is connected to the second waterproof member, wherein the cover member includes an exposed part in which at least a part of the conductive layer is exposed, and the exposed part is disposed to at least partially overlap the through-hole.

A waterproof structure according to exemplary embodiments of the disclosure has a conductive layer disposed higher than a bending portion of a display panel in a through-hole and configured to be electrically connected preferentially with a needle of a dispenser inserted into the through-hole, thereby preventing massive fracture of the display panel by detecting erroneous operations of the needle, and contributing to productivity improvement.

Various other advantageous effects identified explicitly or implicitly through the disclosure may be provided.

BRIEF DESCRIPTION OF DRAWINGS

In describing the drawings, identical or similar reference numerals may be used to designate identical or similar elements.

FIG. 11A is a perspective view of a housing including an electricity-conducting part according to certain embodiments of the disclosure;

DETAILED DESCRIPTION

Figure 1A:
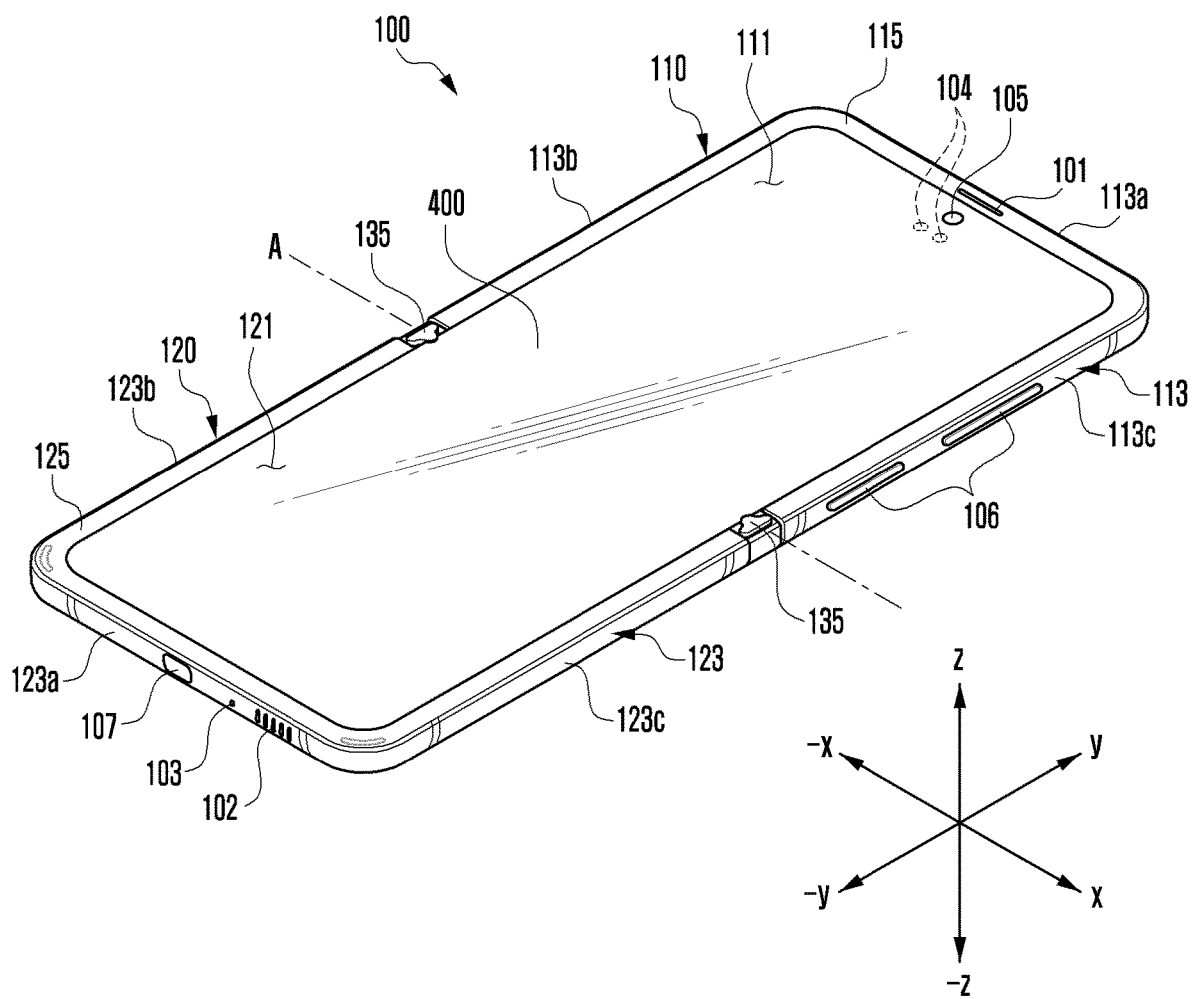
FIG. 1A is a front perspective view illustrating an electronic device in a flat state or an unfolding state according to certain embodiments of the disclosure.
Figure 1B:
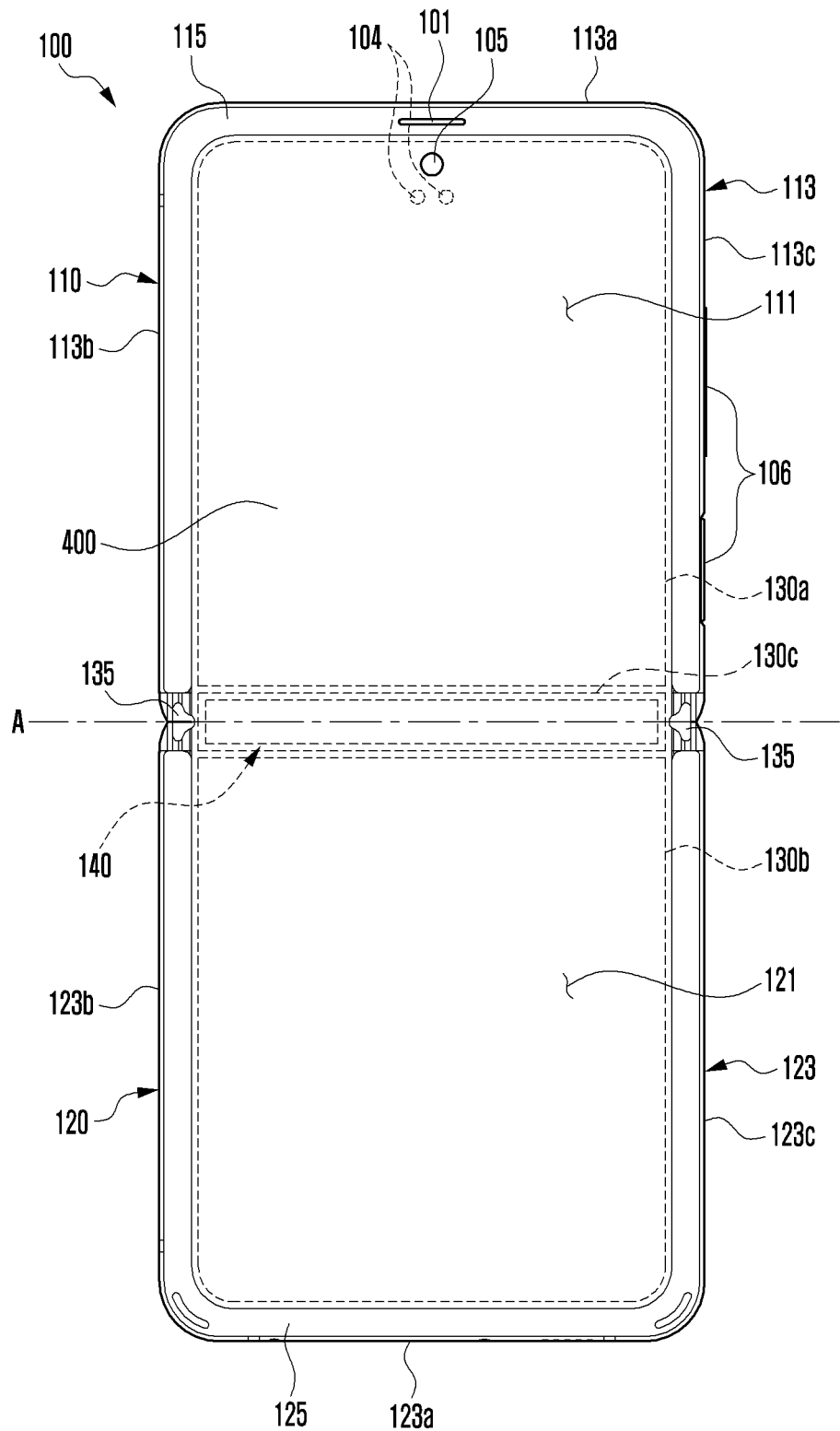
FIG. 1B is a plan view illustrating the front surface of an electronic device in a flat or an unfolding state according to certain embodiments of the disclosure.
Figure 1C:
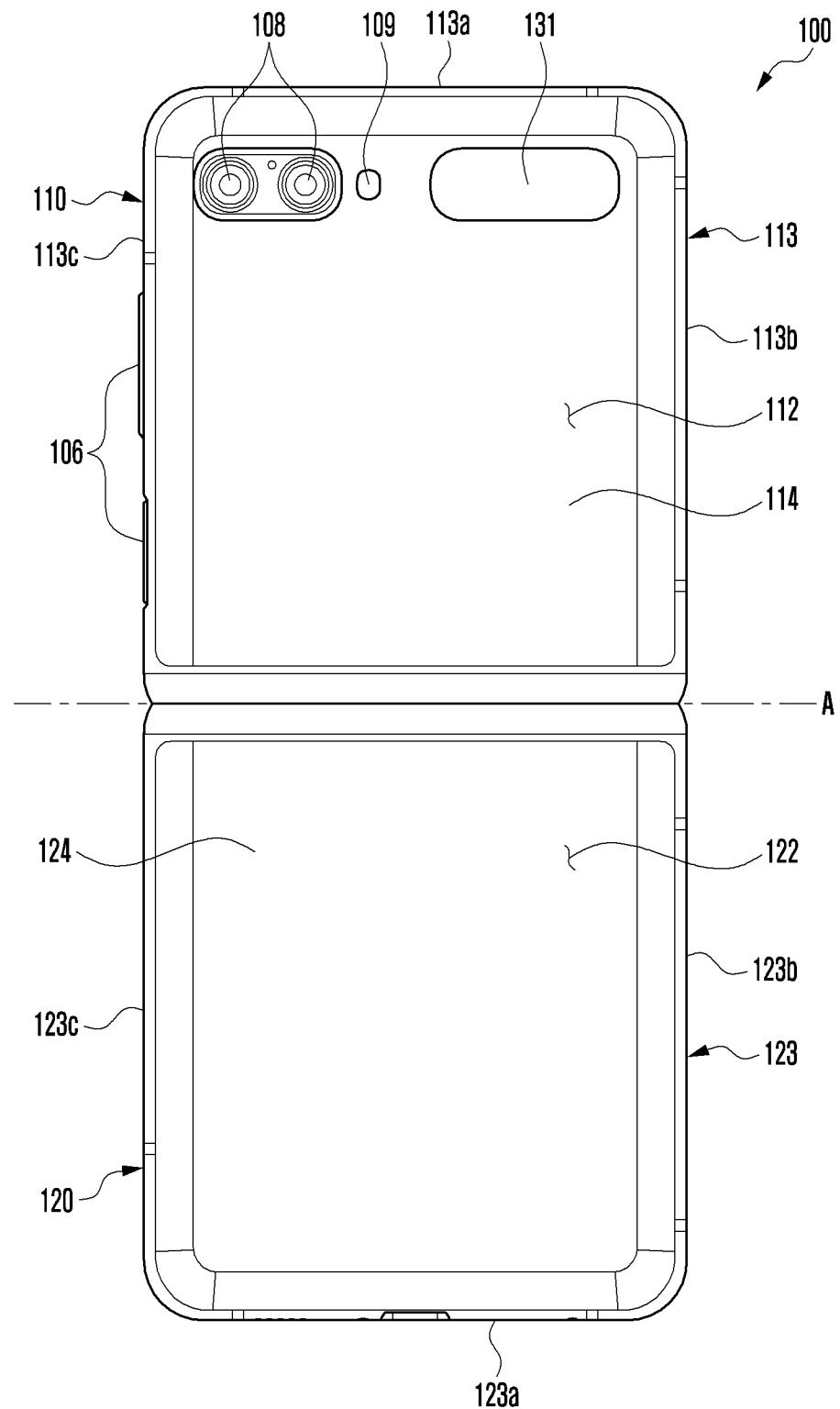
FIG. 1C is a plan view illustrating the rear surface of an electronic device in a flat or an unfolding state according to certain embodiments of the disclosure.

FIG. 1A is a front perspective view of an electronic device in a flat or unfolded state according to certain embodiments of the disclosure. FIG. 1B is a plan view illustrating the front of the electronic device in an unfolded state according to certain embodiments of the disclosure. FIG. 1C is a plan view illustrating the back of the electronic device in an unfolded state according to certain embodiments of the disclosure.

Figure 2A:
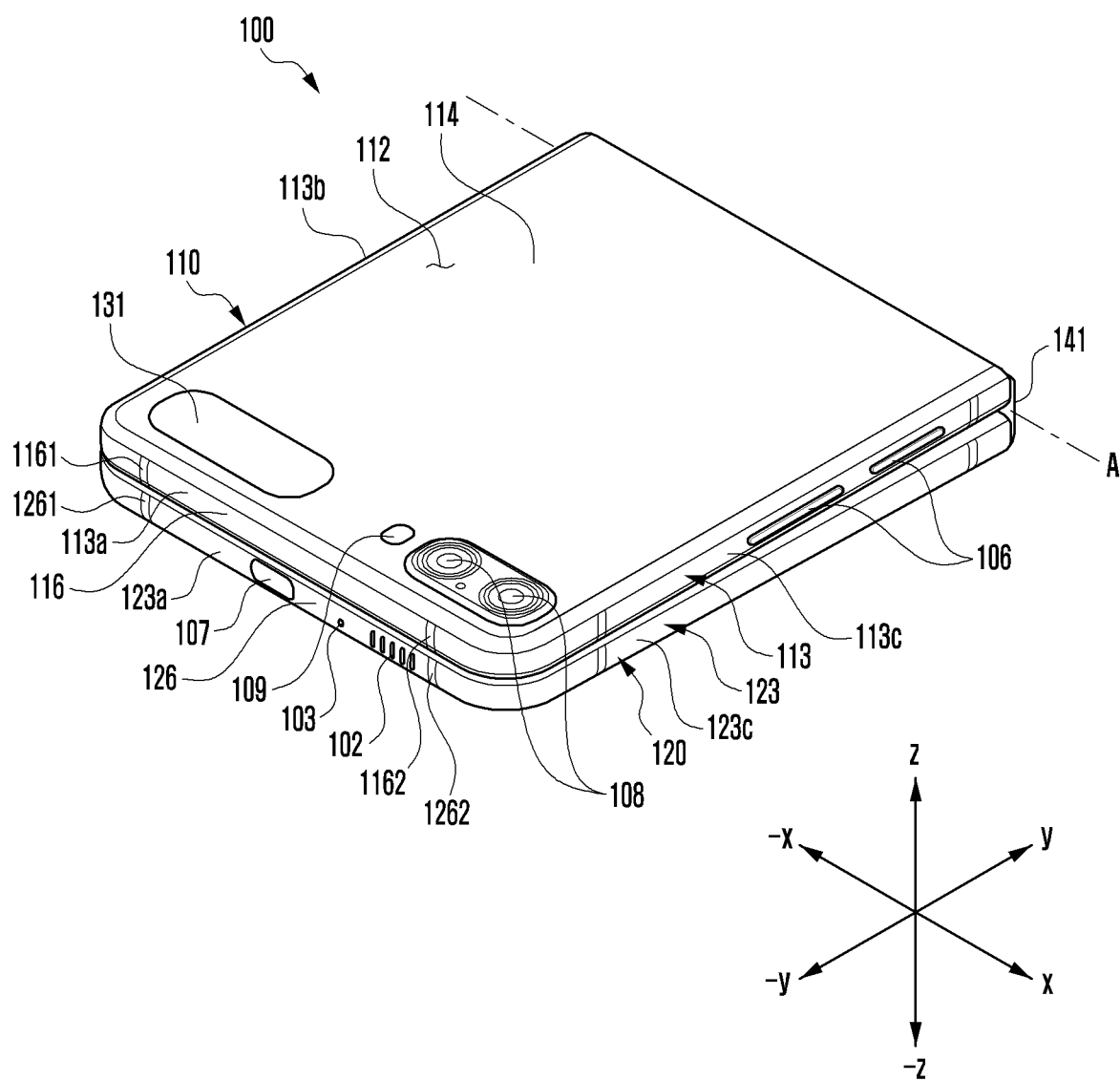
FIG. 2A is a perspective view illustrating an electronic device in a folding state according to certain embodiments of the disclosure.
Figure 2B:
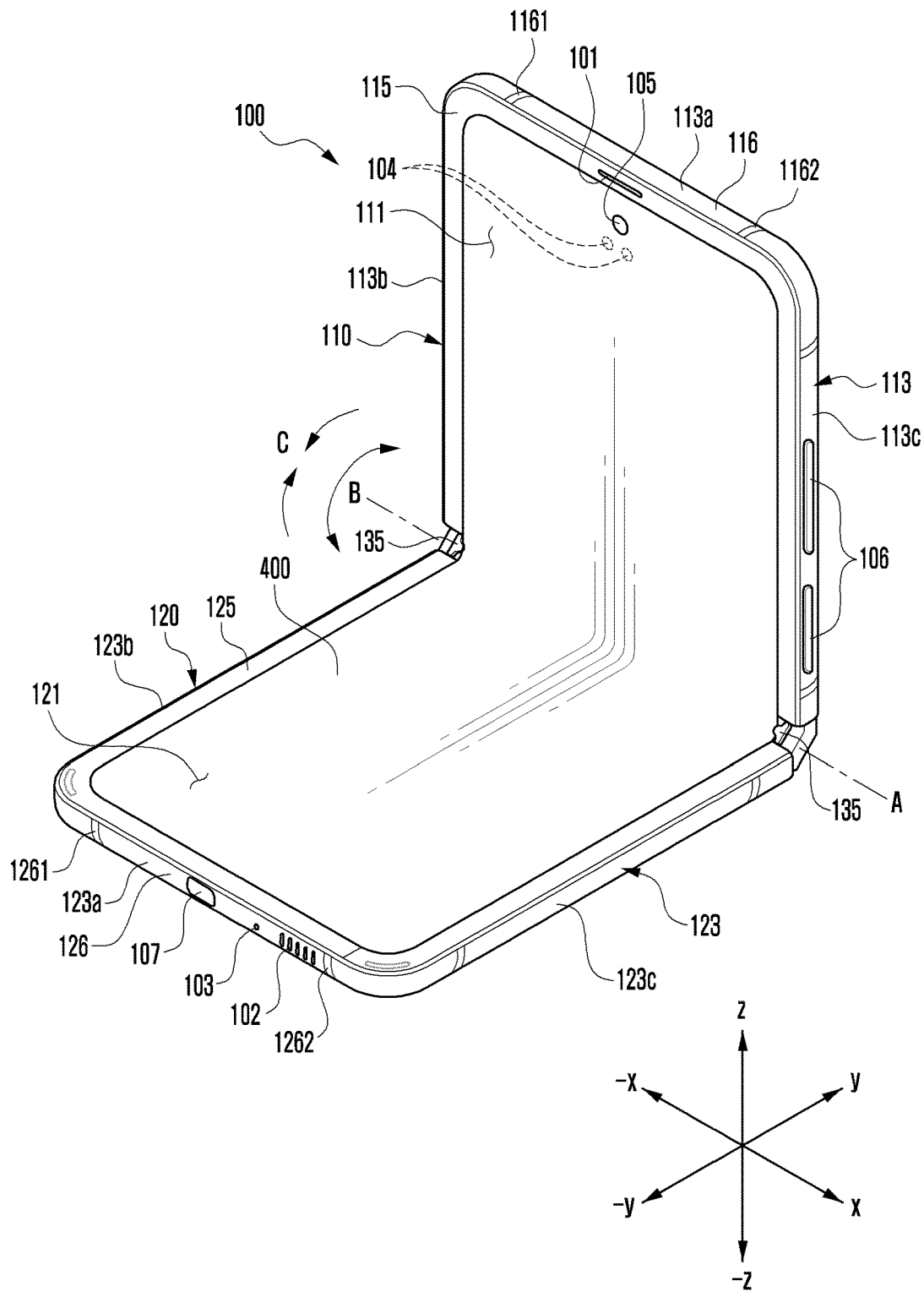
FIG. 2B is a perspective view illustrating an electronic device in an intermediate state according to certain embodiments of the disclosure.

FIG. 2A is a perspective view of the electronic device in a folded state according to certain embodiments of the disclosure. FIG. 2B is a perspective view of the electronic device in an intermediate state according to certain embodiments of the disclosure.

With reference to FIGS. 1A to 2B, the electronic device 100 may include a pair of housings 110 and 120 (e.g., foldable housings) that are rotatably coupled as to allow folding relative to a hinge mechanism (e.g., hinge mechanism 140 in FIG. 1B). In certain embodiments, the hinge mechanism (e.g., hinge mechanism 140 in FIG. 1B) may be disposed in the X-axis direction or in the Y-axis direction. In certain embodiments, two or more hinge mechanisms (e.g., hinge mechanism 140 in FIG. 1B) may be arranged to be folded in a same direction or in different directions. According to an embodiment, the electronic device 100 may include a flexible display 400 (e.g., foldable display) disposed in an area formed by the pair of housings 110 and 120. According to an embodiment, the first housing 110 and the second housing 120 may be disposed on both sides about the folding axis (axis A), and may have a substantially symmetrical shape with respect to the folding axis (axis A). According to an embodiment, the angle or distance between the first housing 110 and the second housing 120 may vary, depending on whether the state of the electronic device 100 is a flat or unfolded state, a folded state, or an intermediate state.

According to certain embodiments, the pair of housings 110 and 120 may include a first housing 110 (e.g., first housing structure) coupled to the hinge mechanism (e.g., hinge mechanism 140 in FIG. 1B), and a second housing 120 (e.g., second housing structure) coupled to the hinge mechanism (e.g., hinge mechanism 140 in FIG. 1B). According to an embodiment, in the unfolded state, the first housing 110 may include a first surface 111 facing a first direction (e.g., front direction) (z-axis direction), and a second surface 112 facing a second direction (e.g., rear direction) (negative z-axis direction) opposite to the first surface 111. According to an embodiment, in the unfolded state, the second housing 120 may include a third surface 121 facing the first direction (z-axis direction), and a fourth surface 122 facing the second direction (negative z-axis direction). According to an embodiment, the electronic device 100 may be operated in such a manner that the first surface 111 of the first housing 110 and the third surface 121 of the second housing 120 face substantially the same first direction (z-axis direction) in the unfolded state, and the first surface 111 and the third surface 121 face one another in the folded state. According to an embodiment, the electronic device 100 may be operated in such a manner that the second surface 112 of the first housing 110 and the fourth surface 122 of the second housing 120 face substantially the same second direction (negative z-axis direction) in the unfolded state, and the second surface 112 and the fourth surface 122 face one another in opposite directions in the folded state. For example, in the folded state, the second surface 112 may face the first direction (z-axis direction), and the fourth surface 122 may face the second direction (negative z-axis direction).

According to certain embodiments, the first housing 110 may include a first side member 113 that at least partially forms an external appearance of the electronic device 100, and a first rear cover 114 coupled to the first side member 113 that forms at least a portion of the second surface 112 of the electronic device 100. According to an embodiment, the first side member 113 may include a first side surface 113a, a second side surface 113b extending from one end of the first side surface 113a, and a third side surface 113c extending from the other end of the first side surface 113a. According to an embodiment, the first side member 113 may be formed in a rectangular shape (e.g., square or rectangle) through the first side surface 113a, second side surface 113b, and third side surface 113c.

According to certain embodiments, the second housing 120 may include a second side member 123 that at least partially forms the external appearance of the electronic device 100, and a second rear cover 124 coupled to the second side member 123, forming at least a portion of the fourth surface 122 of the electronic device 100. According to an embodiment, the second side member 123 may include a fourth side surface 123a, a fifth side surface 123b extending from one end of the fourth side surface 123a, and a sixth side surface 123c extending from the other end of the fourth side surface 123a. According to an embodiment, the second side member 123 may be formed in a rectangular shape through the fourth side surface 123a, fifth side surface 123b, and sixth side surface 123c.

According to certain embodiments, the pair of housings 110 and 120 are not limited to the shape and combinations illustrated herein, and may be implemented with a combination of other shapes or parts. For example, in certain embodiments, the first side member 113 may be integrally formed with the first rear cover 114, and the second side member 123 may be integrally formed with the second rear cover 124.

According to certain embodiments, in the unfolded state of the electronic device 100, the second side surface 113b of the first side member 113 and the fifth side surface 123b of the second side member 123 may be connected without a gap formed therebetween. According to an embodiment, in the unfolded state of the electronic device 100, the third side surface 113c of the first side member 113 and the sixth side surface 123c of the second side member 123 may be connected without a gap formed therebetween. According to an embodiment, in the unfolded state, the electronic device 100 may be configured such that the combined length of the second side surface 113b and the fifth side surface 123b is longer than the combined length of the first side surface 113a and/or the fourth side surface 123a. In addition, the combined length of the third side surface 113c and the sixth side surface 123c may be configured to be longer than the length of the first side surface 113a and/or the fourth side surface 123a.

According to certain embodiments, the first side member 113 and/or the second side member 123 may be formed of a metal, and may further include a polymer injected into the metal. According to an embodiment, the first side member 113 and/or the second side member 123 may include at least one conductive portion 116 and/or 126 electrically segmented through one or more segmenting portions 1161 and 1162 and/or segmenting 1261 and 1262, which may be formed using a polymer. In this case, the at least one conductive portion may be electrically connected to a wireless communication circuit included in the electronic device 100, and may be used as an antenna operating in at least one designated band (e.g., legacy band).

According to certain embodiments, the first rear cover 114 and/or the second rear cover 124 may be formed of, for example, coated or tinted glass, ceramic, polymer, metal (e.g., aluminum, stainless steel or "STS", or magnesium), or a combination thereof.

According to certain embodiments, the flexible display 400 may be disposed to extend from the first surface 111 of the first housing 110 across the hinge mechanism (e.g., hinge mechanism 140 in FIG. 1B) to at least a portion of the third surface 121 of the second housing 120. For example, the flexible display 400 may include a first region 130a substantially corresponding to the first surface 111, a second region 130b corresponding to the second surface 121, and a third region 130c (e.g., the bendable region) connecting the first region 130a and the second region 130b and corresponding to the hinge mechanism (e.g., hinge mechanism 140 in FIG. 1B). According to an embodiment, the electronic device 100 may include a first protection cover 115 (e.g., first protection frame or first decoration member) coupled along the periphery of the first housing 110. According to an embodiment, the electronic device 100 may include a second protection cover 125 (e.g., second protection frame or second decoration member) coupled along the periphery of the second housing 120. According to an embodiment, the first protection cover 115 and/or the second protection cover 125 may be formed of a metal or polymer material. According to an embodiment, the first protection cover 115 and/or the second protection cover 125 may be used as a decorative member. According to an embodiment, the flexible display 400 may be positioned such that the periphery of the first region 130a is interposed between the first housing 110 and the first protection cover 115. According to an embodiment, the flexible display 400 may be positioned such that the periphery of the second region 130b is interposed between the second housing 120 and the second protection cover 125. According to an embodiment, the flexible display 400 may be positioned such that the periphery of the flexible display 400 corresponding to a protection cap 135 is protected through the protection cap disposed in a region corresponding to the hinge mechanism (e.g., hinge mechanism 140 in FIG. 1B). Consequently, the periphery of the flexible display 400 may be substantially protected from the outside. According to an embodiment, the electronic device 100 may include a hinge housing 141 (e.g., hinge cover) that is disposed so as to support the hinge mechanism (e.g., hinge mechanism 140 in FIG. 1B). The hinge housing 141 may further be exposed to the outside when the electronic device 100 is in the folded state, and be invisible as viewed from the outside when retracted into a first space (e.g., internal space of the first housing 110) and a second space (e.g., internal space of the second housing 120) when the electronic device 100 is in the unfolded state. In certain embodiments, the flexible display 400 may be disposed to extend from at least a portion of the second surface 112 to at least a portion of the fourth surface 122. In this case, the electronic device 100 may be folded so that the flexible display 400 is exposed to the outside (out-folding scheme).

According to certain embodiments, the electronic device 100 may include a sub-display 131 disposed separately from the flexible display 400. According to an embodiment, the sub-display 131 may be disposed to be at least partially exposed on the second surface 112 of the first housing 110, and may display status information of the electronic device 100 in place of the display function of the flexible display 400 in case of the folded state. According to an embodiment, the sub-display 131 may be disposed to be visible from the outside through at least some region of the first rear cover 114. In certain embodiments, the sub-display 131 may be disposed on the fourth surface 122 of the second housing 120. In this case, the sub-display 131 may be disposed to be visible from the outside through at least some region of the second rear cover 124.

According to certain embodiments, the electronic device 100 may include at least one of an input device 103 (e.g., microphone), sound output devices 101 and 102, a sensor module 104, camera devices 105 and 108, a key input device 106, or a connector port 107. In the illustrated embodiment, the input device 103 (e.g., microphone), sound output devices 101 and 102, sensor module 104, camera devices 105 and 108, key input device 106, and connector port 107 indicate a hole or shape formed in the first housing 110 or the second housing 120, but may be defined to include a substantial electronic component (e.g., input device, sound output device, sensor module, or camera device) that is disposed inside the electronic device 100 and operated through a hole or a shape.

According to certain embodiments, the input device 103 may include at least one microphone disposed on the second housing 120. In certain embodiments, the input device 103 may include a plurality of microphones disposed to detect the direction of a sound. In certain embodiments, a plurality of microphones may be disposed at appropriate positions in the first housing 110 and/or the second housing 120. According to an embodiment, the sound output devices 101 and 102 may include speakers. According to an embodiment, the input device 103 may include a receiver for calls disposed in the first housing 110, and a speaker disposed in the second housing 120. In certain embodiments, the input device 103, the sound output devices 101 and 102, and the connector port 107 may be disposed in a space arranged in the first housing 110 and/or the second housing 120 of the electronic device 100, and may be exposed to the external environment through at least one hole formed in the first housing 110 and/or the second housing 120. According to an embodiment, at least one connector port 107 may be used to transmit and receive power and/or data to and from an external electronic device. In certain embodiments, at least one connector port (e.g., ear jack hole) may accommodate a connector (e.g., ear jack) for transmitting and receiving an audio signal to and from an external electronic device. In certain embodiments, the hole formed in the first housing 110 and/or the second housing 120 may be commonly used for the input device 103 and the sound output devices 101 and 102. In certain embodiments, the sound output devices 101 and 102 may include a speaker (e.g., piezo speaker) that operates without using a hole formed in the first housing 110 and/or the second housing 120.

According to certain embodiments, the sensor module 104 may generate an electrical signal or data value corresponding to an internal operating state of the electronic device 100 or an external environmental state. The sensor module 104 may detect an external environment, for example, through the first surface 111 of the first housing 110. In certain embodiments, the electronic device 100 may further include at least one sensor module disposed to detect an external environment through the second surface 112 of the first housing 110. According to an embodiment, the sensor module 104 (e.g., illuminance sensor) may be disposed under the flexible display 400 to detect an external environment through the flexible display 400. According to an embodiment, the sensor module 104 may include at least one of a gesture sensor, a gyro sensor, a barometric pressure sensor, a magnetic sensor, an acceleration sensor, a grip sensor, a color sensor, an infrared (IR) sensor, a biometric sensor, a temperature sensor, a humidity sensor, an illuminance sensor, a proximity sensor, a biometric sensor, an ultrasonic sensor, or an illuminance sensor 104.

According to certain embodiments, the camera devices 105 and 108 may include a first camera device 105 (e.g., front camera device) disposed on the first surface 111 of the first housing 110, and a second camera device 108 disposed on the second surface 112 of the first housing 110. The electronic device 100 may further include a flash 109 disposed close to the second camera device 108. According to an embodiment, the camera device 105 or 108 may include one or more lenses, an image sensor, and/or an image signal processor. The flash 109 may include, for example, a light emitting diode or a xenon lamp. According to an embodiment, the camera devices 105 and 108 may be arranged so that two or more lenses (e.g., wide-angle lens, super-wide-angle lens, or telephoto lens) and image sensors are positioned on one surface (e.g., first surface 111, second surface 112, third surface 121, or fourth surface 122) of the electronic device 100. In certain embodiments, the camera devices 105 and 108 may include time-of-flight (TOF) lenses and/or an image sensor.

According to certain embodiments, the key input device 106 (e.g., key button) may be disposed on the third side surface 113c of the first side member 113 of the first housing 110. In certain embodiments, the key input device 106 may be disposed on at least one of the other side surfaces 113a and 113b of the first housing 110 and/or the side surfaces 123a, 123b and 123c of the second housing 120. In certain embodiments, the electronic device 100 may not include some or all of the key input devices 106, and those not included key input devices 106 may be implemented in other forms, such as soft keys, on the flexible display 400. In certain embodiments, the key input device 106 may be implemented by using a pressure sensor included in the flexible display 400.

According to certain embodiments, some of the camera devices 105 and 108 (e.g., first camera device 105) or the sensor module 104 may be disposed to be exposed through the flexible display 400. For example, the first camera device 105 or the sensor module 104 may be arranged in the internal space of the electronic device 100 so as to be in contact with the external environment through an opening (e.g., through hole) formed at least partially in the flexible display 400. In another embodiment, some sensor modules 104 may be arranged in the internal space of the electronic device 100 so as to perform their functions without being visually exposed through the flexible display 400. For example, in this case, the opening of a region of the flexible display 400 facing the sensor module may be not needed.

With reference to FIG. 2B, the electronic device 100 may be operated to remain in an intermediate state through the hinge mechanism (e.g., hinge device 140 in FIG. 1B). In this case, the electronic device 100 may control the flexible display 400 to display different pieces of content on the display area corresponding to the first surface 111 and the display area corresponding to the third surface 121. According to an embodiment, the electronic device 100 may be operated substantially in an unfolded state (e.g., unfolded state of FIG. 1A) and/or substantially in a folded state (e.g., folded state of FIG. 2A) with respect to a specific inflection angle (e.g., angle between the first housing 110 and the second housing 120 in the intermediate state) through the hinge mechanism (e.g., hinge mechanism 140 in FIG. 1B). For example, when a pressing force is applied in the unfolding direction (B direction) in a state where the electronic device 100 is unfolded at a specific inflection angle, through the hinge mechanism (e.g., hinge mechanism 140 in FIG. 1B), the electronic device 100 may be transitioned to an unfolded state (e.g., unfolded state of FIG. 1A). For example, when a pressing force is applied in the folding direction (C direction) in a state where the electronic device 100 is unfolded at a specific inflection angle, through the hinge mechanism (e.g., hinge mechanism 140 in FIG. 1B), the electronic device 100 may be transitioned to a closed state (e.g., folded state of FIG. 2A). In an embodiment, the electronic device 100 may be operated to remain in an unfolded state at various angles (not shown) through the hinge mechanism (e.g., hinge mechanism 140 in FIG. 1B).

FIGS. 1 to 2B illustrate an in-folding scheme in which the first surface 111 of the first housing 110 and the third surface 121 of the second housing 120 face substantially the same first direction (the z-axis direction) when the electronic device 100 is in a flat state or unfolding state, and in which the first surface 111 and the third surface 121 face each other when the electronic device 100 is in a folded state. According to an embodiment, there may be an out-folding scheme in which, the first surface 111 of the first housing 110 and the third surface 121 of the second housing 120 face substantially the same first direction (the z-axis direction) when the electronic device 100 is in a flat state or unfolding state and in which the second surface 112 and the fourth surface 122 face each other when the electronic device 100 is in a folded state.

Figure 3:
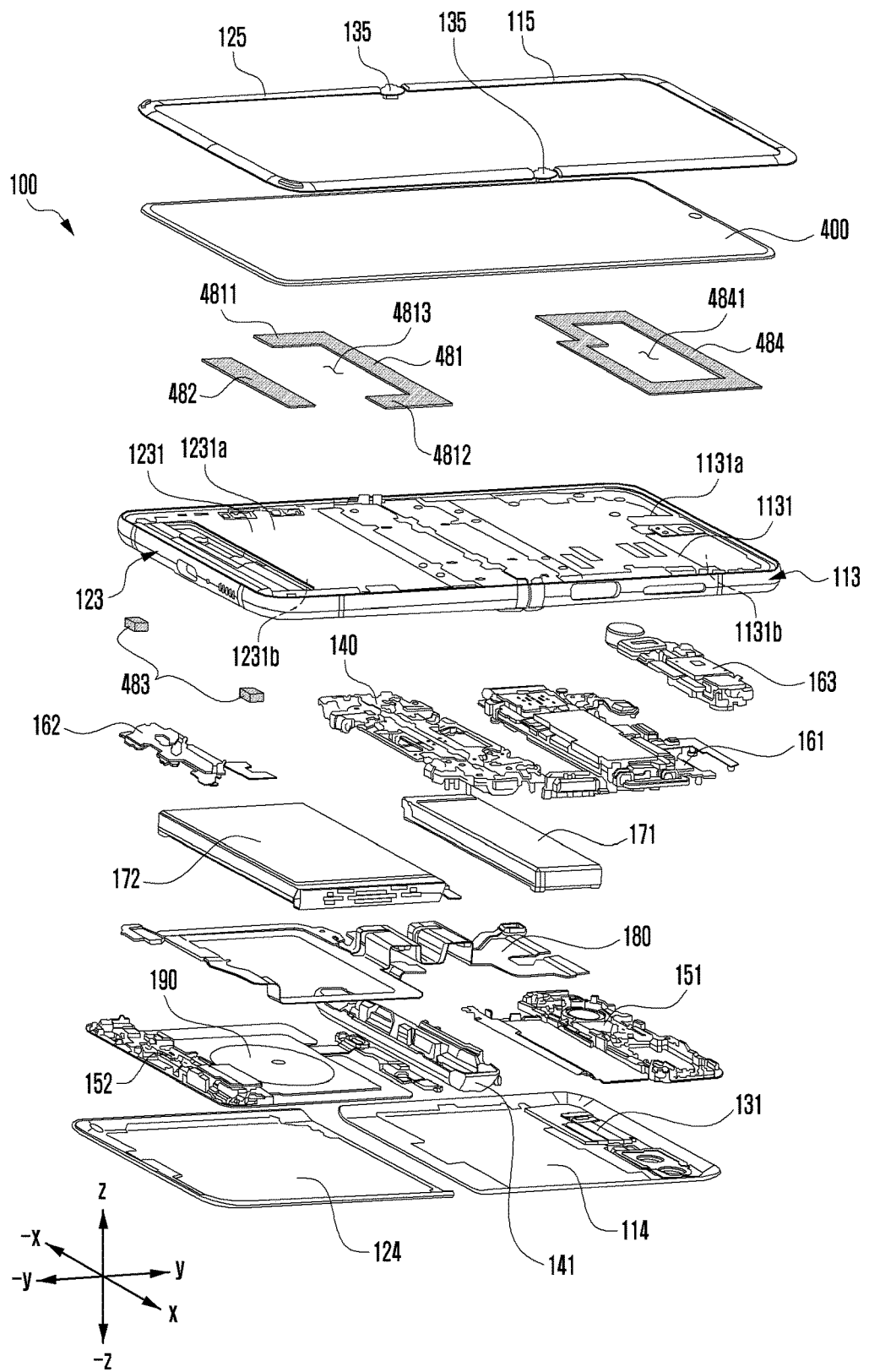
FIG. 3 is an exploded perspective view of an electronic device according to certain embodiments of the disclosure.

FIG. 3 is an exploded perspective view of the electronic device according to certain embodiments of the disclosure.

With reference to FIG. 3, the electronic device 100 may include a first side member 113 (e.g., first side frame), a second side member 123 (e.g., second side frame), and a hinge mechanism 140 (e.g., hinge module) rotatably connecting the first side member 113 and the second side member 123. According to an embodiment, the electronic device 100 may include a first support member 1131 (e.g., first support member) at least partially extending from the first side member 113, and a second support member 1231 at least partially extending from the second side member 123. According to an embodiment, the first support member 1131 may be integrally formed with the first side member 113 or may be structurally coupled to the first side member 113. Similarly, the second support member 1231 may be integrally formed with the second side member 123 or may be structurally coupled to the second side member 123. According to an embodiment, the electronic device 100 may include a flexible display 400 disposed to be supported by the first support member 1131 and the second support member 1231. According to an embodiment, the electronic device 100 may include a first rear cover 114 that is coupled to the first side member 113 and provides a first space between itself and the first support member 1131, and a second rear cover 124 that is coupled to the second side member 123 and provides a second space between itself and the second support member 1231. In certain embodiments, the first side member 113 and the first rear cover 114 may be integrally formed. In certain embodiments, the second side member 123 and the second rear cover 124 may be integrally formed. According to an embodiment, the electronic device 100 may include a first housing 110 (e.g., first housing 110 in FIG. 1A) (e.g., first housing structure) provided through the first side member 113, the first support member 1131, and the first rear cover 114. According to an embodiment, the electronic device 100 may include a second housing (e.g., second housing 120 in FIG. 1A) (e.g., second housing structure) provided through the second side member 123, the second support member 1231, and the second rear cover 124. According to an embodiment, the electronic device 100 may include a sub-display 131 that is disposed to be visible from the outside through at least some region of the first rear cover 114.

According to certain embodiments, the electronic device 100 may include a first substrate assembly 161 (e.g., main printed circuit board), a camera assembly 163, a first battery 171, or a first bracket 151, arranged in the first space between the first side member 113 and the first rear cover 114. According to an embodiment, the camera assembly 163 may include a plurality of camera devices (e.g., camera devices 105 and 108 in FIGS. 1A and 2A), and may be electrically connected to the first substrate assembly 161. According to an embodiment, the first bracket 151 may provide a support structure for supporting the first substrate assembly 161 and/or the camera assembly 163, and improved rigidity. According to an embodiment, the electronic device 100 may include a second board assembly 162 (e.g., sub printed circuit board), an antenna 190 (e.g., coil member), a second battery 172, or a second bracket 152, arranged in the second space between the second side member 123 and the second rear cover 124. According to an embodiment, the electronic device 100 may include a wiring member 180 (e.g., FPCB) extending from the first substrate assembly 161 across the hinge mechanism 140 to a plurality of electronic components arranged between the second side member 123 and the second rear cover 124, to provide electrical connections therebetween. According to an embodiment, the antenna 190 may include a near field communication (NFC) antenna, a wireless charging antenna, and/or a magnetic secure transmission (MST) antenna. The antenna 190 may, for example, perform short-range communication with an external device or wirelessly transmit and receive power utilized for charging.

According to certain embodiments, the electronic device 100 may include a hinge housing 141 (e.g., hinge cover) that supports the hinge mechanism 140 and is disposed so as to be exposed to the outside when the electronic device 100 is in the folded state (e.g., folded state of FIG. 2A) and be invisible from the outside by being retracted into the first space and/or the second space when the electronic device 100 is in the unfolded state (e.g., unfolded state of FIG. 1A).

According to certain embodiments, the electronic device 100 may include a first protection cover 115 coupled along the periphery of the first side member 113. According to an embodiment, the electronic device 100 may include a second protection cover 125 coupled along the periphery of the second side member 123. According to an embodiment, in the flexible display 400, the periphery of a first flat portion (e.g., first flat portion 130a in FIG. 1B) may be protected by the first protection cover 115. According to an embodiment, in the flexible display 400, the periphery of a second flat portion (e.g., second flat portion 130b in FIG. 1B) may be protected by the second protection cover 125. According to an embodiment, the electronic device 100 may include a protection cap 135 that protects the periphery of the third region (e.g., third region 130c in FIG. 1B) of the flexible display 400 corresponding to the hinge mechanism 140.

According to certain embodiments, the first support member 1131 may include a first support surface 1131a facing a first direction (z-axis direction), and a second support surface 1131b facing a second direction (negative z-axis direction) opposite to the first direction. According to an embodiment, the second support member 1231 may include a third support surface 1231a facing the first direction, and a fourth support surface 1231b facing the second direction in the unfolded state. According to an embodiment, the flexible display 400 may be supported by the first support surface 1131a of the first support member 1131 and the third support surface 1231a of the second support member 1231.

According to certain embodiments, the flexible display 400 may include a bending part (e.g., a bending part 432 in FIG. 4) which includes an extension part (e.g., an extension part 4321 in FIG. 4) extending from a display panel (e.g., the display panel 430 in FIG. 4) and a flexible substrate (e.g., the flexible substrate 4322 in FIG. 4) (e.g., a flexible printed circuit board FPCB)) connected to the extension part 4321. As shown, the bending part 432 may be bent in a second direction (the −z-axis direction) from the flexible display, and may be disposed so as to be attached to the rear surface (e.g., the rear surface of the polarizer (POL) 420 in FIG. 4) of the flexible display 400. According to an embodiment, the bending part 432 may include a control circuit (e.g., a display driver IC (DDI) (e.g., a control circuit 4321a in FIG. 4) configured to control driving of a flexible display, and other multiple electrical elements (e.g., electrical elements 4322a in FIG. 5A).

According to certain embodiments, the electronic device 100 may include at least one waterproof member 481, 482, 483, or 484 disposed between the flexible display 400 and the second support member 1231 and between the flexible display 400 and the first support member 1131. As shown, some waterproof members 481, 482, and 483 among at least one waterproof member 481, 482, 483, or 484 may include a first waterproof member 481 disposed to at least partially surround the bending part 432 between the flexible display 400 and the second support member 1231, a second waterproof member 482 disposed between the extension part (e.g., the extension part 4321 in FIG. 4) and the second support member 1231, and third waterproof members 483 connecting one end 4811 of the first waterproof member 481 to one end of the second waterproof member 482 and connecting the other end 4812 of the first waterproof member 481 to the other end of the second waterproof member 482. According to an embodiment, at least one waterproof member 484 may also include a fourth waterproof member 484 which has a closed loop shape and is disposed between the flexible display 400 and the first support member 1131. According to an embodiment, the control circuit (e.g., the control circuit 4321a in FIG. 4) and multiple electrical elements (e.g., electrical elements 4322a in FIG. 5A), disposed in the bending part 432, may be disposed in a sealed first waterproof space 4813 formed through the first waterproof member 481, the second waterproof member 482, and the third waterproof members 483 between the flexible display 400 and the second support member 1231, and thus may be protected from external water and/or foreign matter. According to an embodiment, at least one electronic component (e.g., a sensor module (e.g., the sensor module 104 in FIG. 1A) and/or a camera device (e.g., the camera device 105 in FIG. 1A)) disposed through the first support member 1131 may be disposed in a second waterproof space 4841 formed by the closed loop shape of the fourth waterproof member 484 between the flexible display 400 and the first support member 1131, and thus may be protected from external water and/or foreign matter.

According to certain embodiments, the first waterproof member 481 may be disposed between the third support surface 1231a of the second support member 1231 and the flexible display 400, and the second waterproof member 482 may be disposed between the bent extension part (e.g., the extension part 4321 in FIG. 4) and the third support surface 1231a. Thus, discontinuous sections having different heights may be formed. According to an embodiment, the third waterproof members 483 may connect the first waterproof member 481 to the second waterproof member 482 by being injected into through-holes (e.g., through-holes 483a in FIG. 6A) formed in corresponding positions of the second support member 1231. According to an embodiment, the third waterproof members 483 may be injected through through-holes (e.g., the through-holes 483a in FIG. 6A), formed from the fourth support surface 1231b (e.g., in a direction from the −z-axis to the z-axis), while a part of the flexible display 400 is attached to the third support surface 1231a through the first waterproof member 481 and the second waterproof member 482. According to an embodiment, the third waterproof members 483 may be injected into the through-holes (e.g., (e.g., the through-holes 483a in FIG. 6A) through a needle (e.g., the needle 610 in FIG. 6B) of a dispenser (e.g., the dispenser 600 in FIG. 6B). For example, the third waterproof members 483 may be injected so as to connect, to each other, a part of the first waterproof member 481 and a part of the second waterproof member 482, which are exposed in the through-holes (e.g., the through-holes 483a in FIG. 6A), in a state in which at least a part of a needle (e.g., the needle 610 in FIG. 6B) is partially inserted into through-holes (e.g., the through-holes 483a in FIG. 6A). However, when the needle (e.g., the needle 610 in FIG. 6B) is excessively inserted into the through-holes (e.g., the through-holes 483a in FIG. 6A) due to malfunction of the dispenser 600 other mechanisms during manufacturing process, the needle (e.g., the needle 610 in FIG. 6B) may be brought into contact with the display panel (e.g., the display panel 430 in FIG. 4) (e.g., the extension part 4321) exposed in the through-holes (e.g., the through-holes 483a in FIG. 6A), thereby causing damage to the display panel (e.g., the display panel 430 in FIG. 4). During operation, a worker or devices using an automatic process may not detect this error, and thus undesirably a large number of defective products may be produced.

Figure 6A:
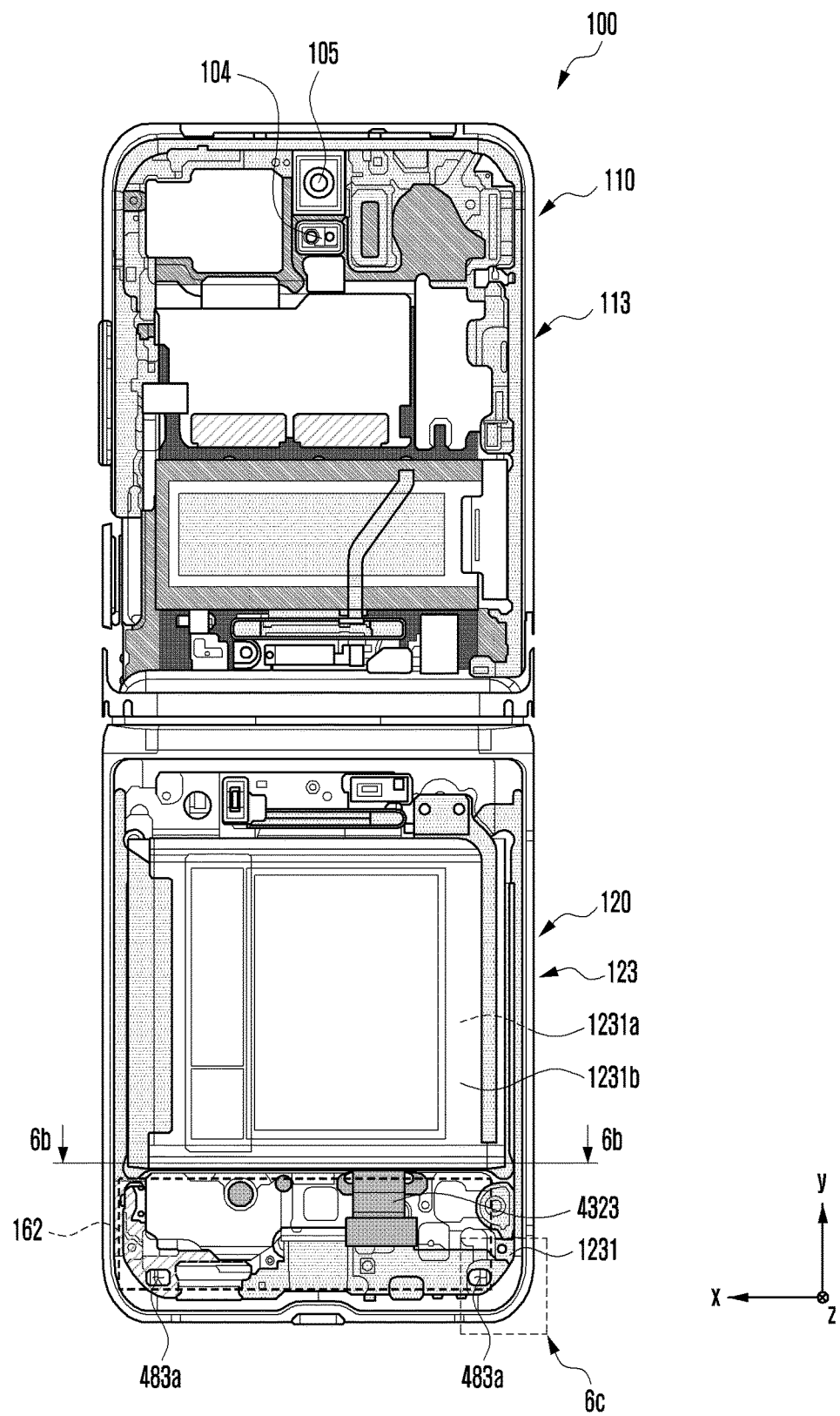
FIG. 6A illustrates a configuration of an electronic device from which a first rear cover and a second rear cover according to certain embodiments of the disclosure have been removed.

To avoid the above drawbacks, the electronic device 200 according to an exemplary embodiment of the disclosure may be provided with an electricity-conducting structure (e.g., a detection structure) for detecting contact of a needle (e.g., the needle 610 in FIG. 6B) made of a conductive material when the needle (e.g., the needle 610 in FIG. 6B) is excessively inserted into through-holes (e.g., the through-holes 483a in FIG. 6A). When the needle (e.g., the needle 610 in FIG. 6B) malfunctions (e.g., is excessively inserted), the manufacturing process is promptly halted through the electricity-conducting structure as explained hereinafter, thereby reducing additional occurrence of defective products and thus improving productivity.

Figure 4:
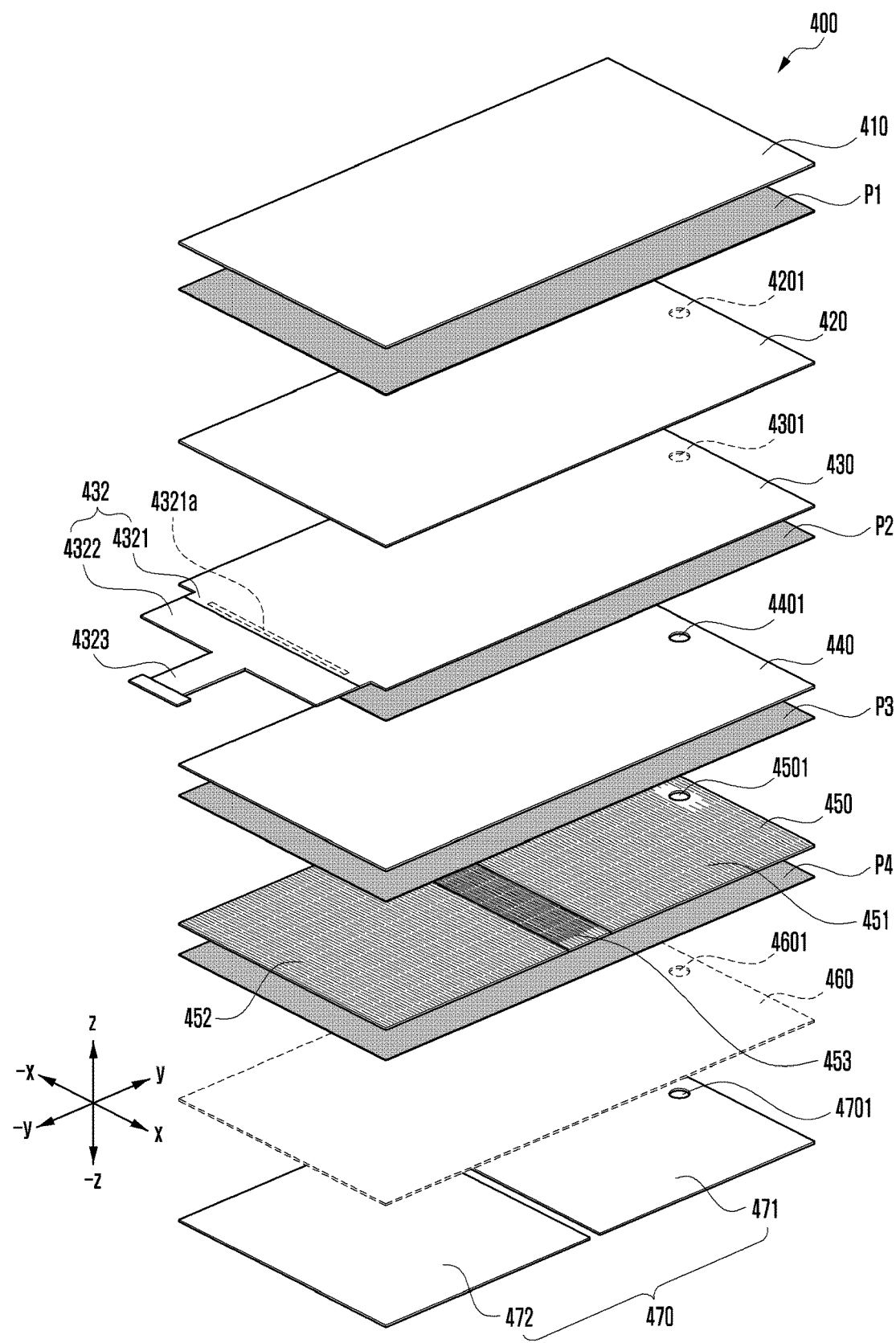
FIG. 4 is an exploded perspective view of a flexible display 400 according to certain embodiments of the disclosure.

FIG. 4 is an exploded perspective view of a flexible display according to various embodiments of the disclosure.

Referring back to FIG. 4, a display (e.g., a flexible display 400) according to exemplary embodiments of the disclosure may include an unbreakable (UB) type OLED display (e.g., a curved display). However, the flexible display 400 is not limited thereto, and may also include a flat type display of an on-cell touch active matrix organic light-emitting diode (AMOLED) (OCTA) scheme.

As shown, the flexible display 400 may include a window layer 410, and a polarizer (POL) 420 (e.g., a polarizing film), a display panel 430, a polymer layer 440, a metal sheet layer 450, and a reinforcement plate 470, which are sequentially disposed on the rear surface of the window layer 410 (e.g., the −z-axis direction). Here, the flexible display 400 may also include a digitizer 460 disposed between the polymer layer 440 and the metal sheet layer 450 or between the metal sheet layer 450 and the reinforcement plate 470. In another embodiment, the digitizer 460 may also be disposed between the polymer layer 440 and the metal sheet layer 450.

According to certain embodiments, the window layer 410 may include a glass layer, The window layer 410 may also include ultra-thin glass (UTG). In another embodiment, the window layer 410 may also include polymer. In this case, the window layer 410 may include polyethylene terephthalate (PET) or polyimide (PI). In yet another embodiment, the window layer 410 may also be disposed as multiple layers so as to include glass layer and polymer.

According to certain embodiments, the window layer 410, the polarizer 420, the display panel 430, the polymer layer 440, and the metal sheet layer 450 may be disposed across at least a part of each of a first surface (e.g., the first surface 111 in FIG. 1A) of a first housing (e.g., the first housing 110 in FIG. 1A) and a third surface (e.g., the third surface 121 in FIG. 1A) of a second housing (e.g., the second housing 120 in FIG. 1A). According to an embodiment, the reinforcement plate 470 may include a first reinforcement plate 471 facing the first housing (e.g., the first housing 110 in FIG. 1A) and a second reinforcement plate 472 facing a second housing (e.g., the second housing 120 in FIG. 1A). According to an embodiment, the window layer 410, the polarizer 420, the display panel 430, the polymer layer 440, the metal sheet layer 450, and the reinforcement plate 470 may be attached to each other by adhesives P1, P2, P3, and P4 (or bonding agents). For example, the adhesives P1, P2, P3, and P4 may include at least one of an optical clear adhesive (OCA), a pressure sensitive adhesive (PSA), a heat-activated adhesive, a normal adhesive, or a double-sided tape.

According to certain embodiments, the display panel 430 may include multiple pixels and a wiring structure (e.g., an electrode pattern). According to an embodiment, the polarizer 420 may selectively allow light, generated from a light source of the display panel 430 and oscillating in a predetermined direction, to pass therethrough. According to an embodiment, the display panel 430 and the polarizer 420 may be integrally formed. According to an embodiment, the flexible display 400 may also include a touch panel (not shown).

According to certain embodiments, the polymer layer 440 may be disposed beneath the display panel 430 to provide a dark background for ensuring visibility of the display panel 430, and may be formed of a cushion material for impact-absorbing action. For the waterproofness of the flexible display 400, the polymer layer 440 may be removed or disposed beneath the metal sheet layer 450.

According to certain embodiments, the metal sheet layer 450 may provide a bending characteristic to the flexible display 400. For example, the metal sheet layer 450 may include a first flat part 451 corresponding to the first surface (e.g., the first surface 111 in FIG. 1A) of the first housing (e.g., the first housing 110 in FIG. 1A), a second flat part 452 corresponding to a third surface (e.g., the third surface 121 in FIG. 1A) of a second housing (e.g., the second housing 120 in FIG. 1A), and a bendable part 453 corresponding to a hinge device (e.g., the hinge device 140 in FIG. 1B) and connecting the first flat part 451 to the second flat part 452. According to an embodiment, the metal sheet layer 450 may contain at least one of steel use stainless (SUS) (e.g., stainless steel (STS)), Cu, Al, or metal CLAD (e.g., a lamination member in which SUS and Al are alternately disposed). In an embodiment, the metal sheet layer 450 may contain other alloy materials. The metal sheet layer 450 may contribute to reinforcement of the rigidity of an electronic device (e.g., the electronic device 100 in FIG. 1A), and may be used to shield ambient noise and dissipate heat radiated from ambient heat-radiating components. According to an embodiment, at least a part (e.g., the bendable part 453) of the metal sheet layer 450 may be formed of a material different from that of another part (e.g., the first flat part 451 or the second flat part 452).

According to certain embodiments, the display 400 may include the digitizer 460 as a detection member which is disposed beneath the metal sheet layer 450 and receives an input of an electronic pen (e.g., a stylus). For example, the digitizer 460 may include a coil member which is disposed on a dielectric substrate so as to detect an electromagnetically induced resonance frequency applied from the electronic pen.

According to certain embodiments, the flexible display 400 may include at least one functional member (not shown) disposed between the polymer layer 440 and the metal sheet layer 450 or beneath the metal sheet layer 450. The functional member may include a graphite sheet for heat dissipation, an added display, a force touch FPCB, a finger sensor FPCB, a communication antenna radiator, or a conductive/nonconductive tape. The functional member may be disposed in each of the first housing (e.g., the first housing 110 in FIG. 1A) and the second housing (e.g., the second housing 120 in FIG. 1A). According to an embodiment, if bendable, the functional member may be disposed from the first housing (e.g., the first housing 110 in FIG. 1A) to at least part of the second housing (e.g., the second housing 120 in FIG. 1A) via the hinge device (e.g., the hinge device 140 in FIG. 1B).

According to certain embodiments, an electronic device (e.g., the electronic device 100 in FIG. 1A) may include a camera device (e.g., the first camera device 105 in FIG. 1A) disposed under the flexible display 400 and configured to detect an external environment through the flexible display 400. The electronic device (e.g., the electronic device 100 in FIG. 1A) may include at least one sensor module (e.g., the sensor module 104 in FIG. 1A) (e.g., an illuminance sensor, a proximity sensor, or a TOF sensor) disposed under the flexible display 400. According to an embodiment, the polarizer 420, the display panel 430, the polymer layer 440, the metal sheet layer 450, and the reinforcement plate 470 may include through-holes 4201, 4301, 4401, 4501, 4601 and 4701, respectively. In an embodiment, the display panel 430 and/or the polarizer 420 may adjust the transmissivity of a corresponding region, thereby making the through-holes 4201 and 4301 unnecessary. The size of the through-holes 4201, 4301, 4401, 4501, and 4601 may be formed based on the size of the camera device (e.g., the first camera device 105 in FIG. 1A) and/or the field of view of the camera device (e.g., the first camera device 105 in FIG. 1A), and the through-holes 4201, 4301, 4401, 4501, 4601 and 4701 may have different sizes. In an embodiment, at least one of the through-holes 4201, 4301, 4401, 4501, 4601 and 4701 may further include at least one additional support member (e.g., a lens).

According to certain embodiments, the flexible display 400 may include a bending part 432 disposed to be foldable from the display panel 430 toward at least a partial region of the rear surface of the flexible display 400 (e.g., in the −z-axis direction). The bending part 432 may include an extension part 4321, which extends from the display panel 430 and includes a control circuit 4321a. The bending part 432 may include a flexible substrate 4322, which is electrically connected to the extension part 4321 and includes multiple electrical elements. According to an embodiment, the control circuit 4321a may include a display driver IC (DDI) or a touch display driver IC (TDDI), installed in the extension part 4321 having an electrical wiring structure. According to an embodiment, the control circuit 4321a may have a chip on panel (COP) or chip on plastic structure in which the same is directly disposed in the extension part 4321. In an embodiment, the control circuit 4321a may have a chip on film (COF) structure in which the same is installed in a separate connection film (not shown) for connecting the extension part 4321 to the flexible substrate 4322. According to an embodiment, the flexible display 400 may include multiple electrical elements (e.g., electrical elements 4322a in FIG. 5A) disposed on the flexible substrate 4322. The flexible display 400 may include a connector 4323 which extends from the flexible substrate 4322 and is electrically connected to a substrate (e.g., the second substrate assembly 162 in FIG. 3) of an electronic device (e.g., the electronic device 100 in FIG. 3). According to an embodiment, the multiple electrical elements 4322a may include a touch IC, a display flash memory, an ESD prevention diode, a pressure sensor, a fingerprint sensor, or a passive element such as decap (decoupling capacitor). In another embodiment, when the bending part 432 is disposed in a region of the flexible display 400, facing the first housing (e.g., the first housing 110 in FIG. 1), the connector 4323 may be electrically connected to another substrate (e.g., the first substrate assembly 161 in FIG. 3) of the electronic device (e.g., the electronic device 100 in FIG. 3).

According to certain embodiments of the disclosure, an electronic device (e.g., the electronic device 100 in FIG. 3) may include a waterproof/dustproof structure, which is bent toward the rear surface of the flexible display 400, and serves to protect at least a part (e.g., the extension part 4321) of the bending part 432, which includes the control circuit and the multiple electrical elements, from external water and/or foreign matter. According to an embodiment, at least a part of the waterproof/dustproof structure may include an electricity-conducting structure (e.g., a detection structure) of the needle (610) applied during a process of disposing the third waterproof members 483 for connecting the first waterproof member 481 to the second waterproof member 482.

Hereinafter, a detailed description will be made of the waterproof/dustproof structure and the electricity-conducting structure with which the electronic device 100 is provided for the at least a portion of the bending part 432.

Figure 5A:
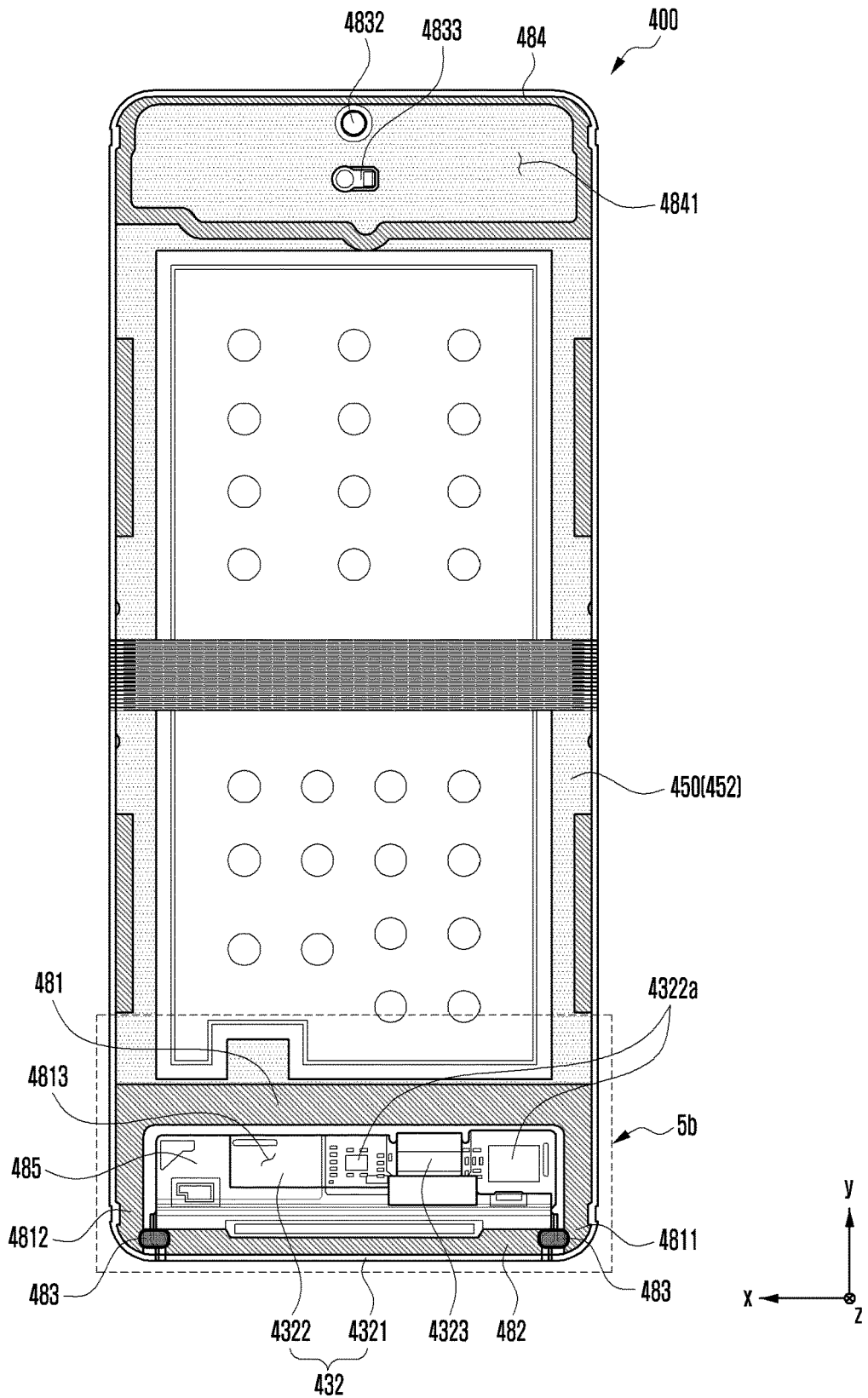
FIG. 5A is a plan view illustrating the rear surface of a flexible display according to certain embodiments of the disclosure.
Figure 5B:
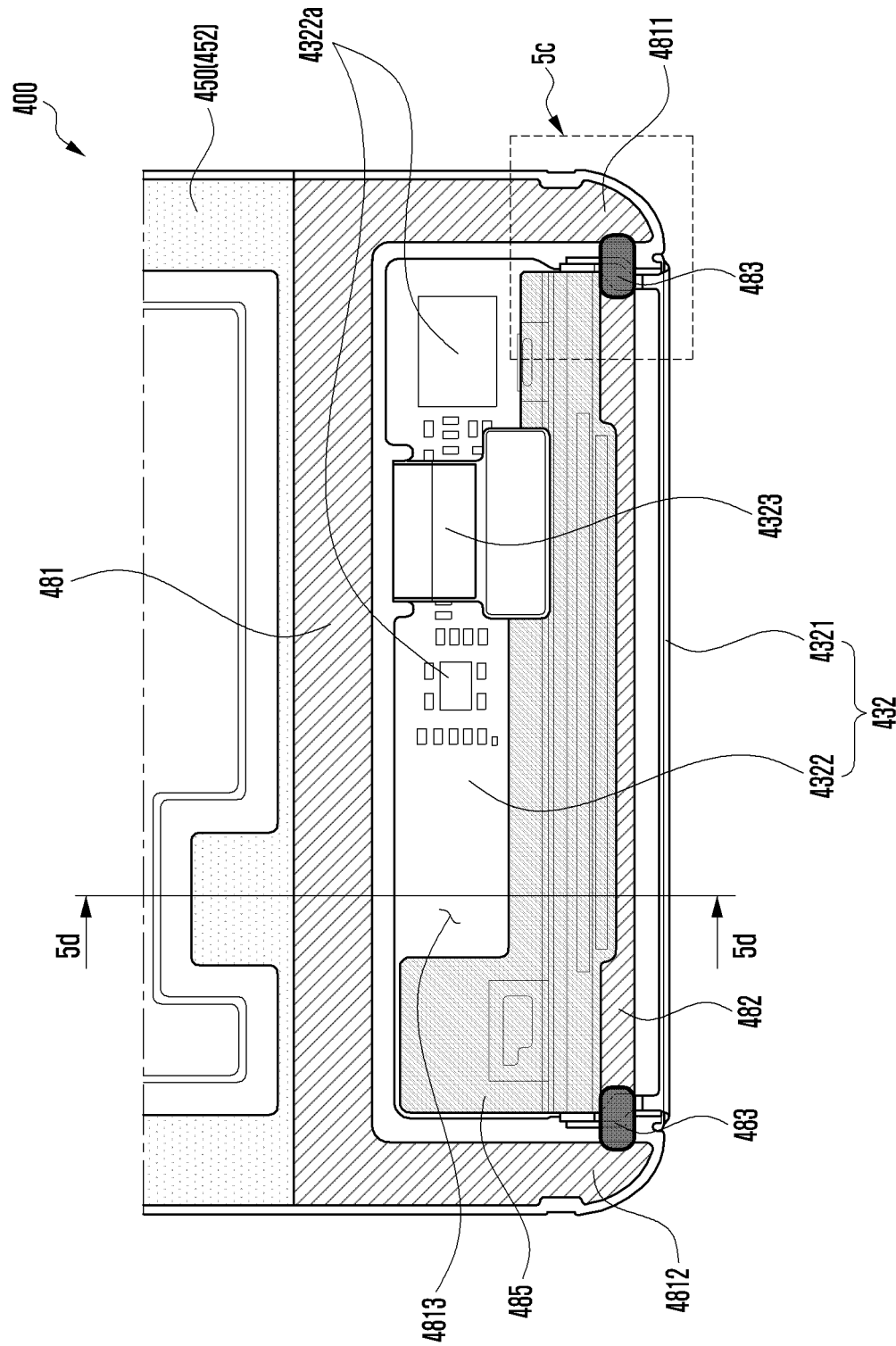
FIG. 5B is an enlarged view of a region 5b in FIG. 5A according to certain embodiments of the disclosure.
Figure 5C:
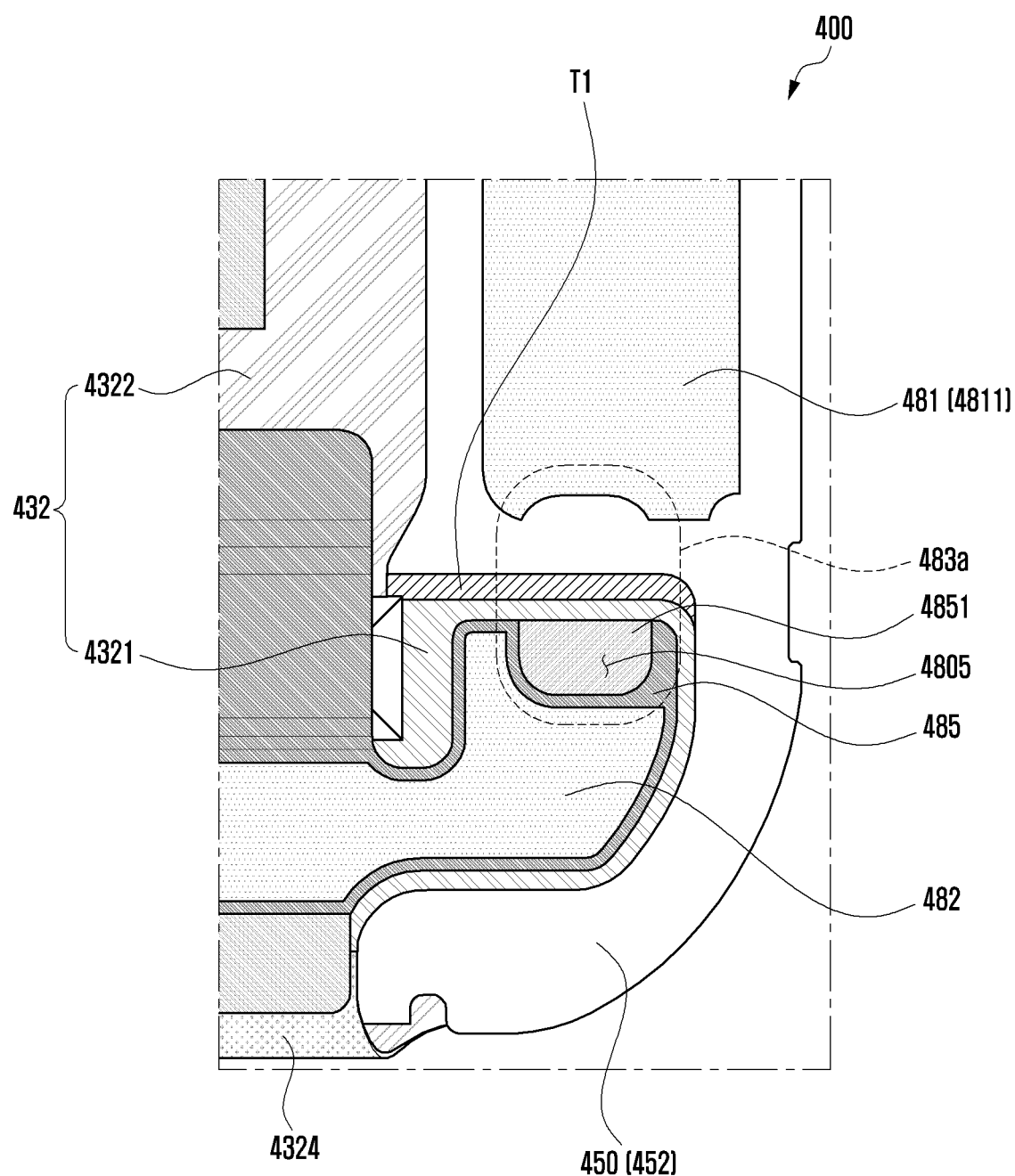
FIG. 5C is an enlarged view of a region 5c in FIG. 5B according to certain embodiments of the disclosure.
Figure 5D:
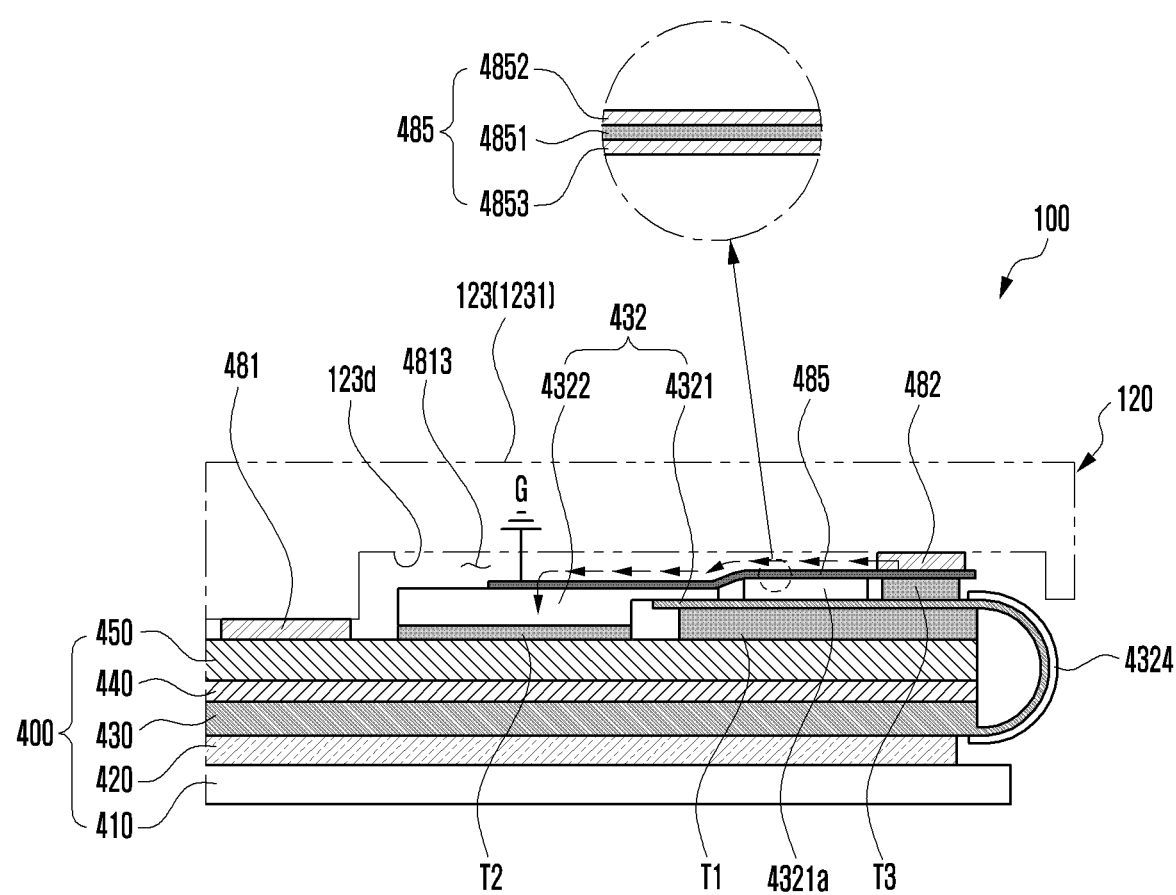
FIG. 5D is a partial cross-sectional view of a flexible display seen along line 5d-5d in FIG. 5B according to certain embodiments of the disclosure.

FIG. 5A is a plan view illustrating the rear surface of a flexible display according to certain embodiments of the disclosure. FIG. 5B is an enlarged view of a region 5b in FIG. 5A according to Certain embodiments of the disclosure. FIG. 5C is an enlarged view of a region 5c in FIG. 5B according to certain embodiments of the disclosure. FIG. 5D is a partial cross-sectional view of a flexible display seen along line 5d-5d in FIG. 5B according to Certain embodiments of the disclosure.

Referring to FIGS. 5A to 5D, the electronic device 100 may include a flexible display 400 disposed to be supported by a first support member (e.g., the first support member 1131 in FIG. 3) of a first housing (e.g., the first housing 110 in FIG. 3) and a second support member (e.g., the second support member 1231 in FIG. 3) of a second housing (e.g., the second housing 120 in FIG. 3). According to an embodiment, the flexible display 400 may include a bending part 432 which extends outward from a display panel (e.g., the display panel 430 in FIG. 4) and is foldably disposed on the rear surface of the flexible display 400. The flexible display 400 may further include a bending part protection layer 4324 (e.g., a bending protection layer (BPL)) laminated on the outer surface of the bending part 432 so as to protect at least a portion of the bending part 432. The bending part 432 may include an extension part 4321, which extends from the display panel (e.g., the display panel 430 in FIG. 4) and includes a control circuit 4321a, and a flexible substrate 4322, which is connected to the extension part 4321 and includes multiple electrical elements 4322a. According to an embodiment, the bending part 432 may be bent toward the rear surface of the flexible display 400 and then be attached to a metal sheet layer 450. A ground (G) of the flexible substrate 4322 may be electrically connected to the metal sheet layer 450 which in turn helps to prevent malfunctions (e.g., a flicker phenomenon) of the flexible display. In an embodiment, when the reinforcement plate 470 (e.g., the second reinforcement plate 472 in FIG. 4) is additionally laminated on the metal sheet layer, the bending part 432 may be attached to the reinforcement plate 470. As illustrated in FIG. 5A, the bending part 432 may be disposed to face at least a part of the second flat part 452 of the metal sheet layer 450 corresponding to the second support member 1231 of the second housing 120. In this case, the second support member 1231 may include a recess (e.g., a recess 123d in FIG. 5D) formed lower than the outer surface in order to receive the bending part 432. In an embodiment, the bending part 432 may be disposed in a position in which the same faces the first flat part 451 of the metal sheet layer 450 corresponding to the first support member 1131 of the first housing 110.

According to certain embodiments, the electronic device 100 may include at least one waterproof member 481, 482, and 483. In the embodiment, the at least one waterproof member 481, 482, and 483 may include a first waterproof member 481 disposed to surround at least a portion of the bending part 432 between the metal sheet layer 450 of the flexible display 400 and the second support member 1231, a second waterproof member 482 disposed between the extension part 4321 and the second support member 1231, and a third waterproof members 483 connecting one end 4811 of the first waterproof member 481 to one end of the second waterproof member 482 and connecting the other end 4812 of the first waterproof member 481 to the other end of the second waterproof member 482. According to an embodiment, the first waterproof member 481 and the second waterproof member 482 may include at least one among a tape, an adhesive, waterproof dispensing, silicone, waterproof rubber, and urethane. When the first waterproof member 481 and the second waterproof member 482 are integrally formed, water or foreign matter may be introduced through a gap formed by a height difference (a step) between the bending part 432 and the metal sheet layer 450. To address this, according to an exemplary embodiment of the disclosure, the first waterproof member 481 may be attached while being spaced a designated interval apart from the second waterproof member 482 at the above-described stepped part, and the stepped part including the corresponding interval may be connected through the third waterproof members 483 without leaving any gap. According to an embodiment, the third waterproof members 483 may a cured-in-place gasket (CIPG) (e.g., a waterproof filling member) which contains a semi-solid or liquid material and has properties which allow the same to be solidified by natural or external conditions (e.g., heat, ultraviolet rays, humidity, or pressure). Therefore, the control circuit 4321*a* and the multiple electrical elements 4322*a* may be disposed in a closed loop-shaped first waterproof space 4813 that is formed by the first waterproof member 481, the second waterproof member 482, and the third waterproof members 483 between the flexible display 400 and the second support member 1231 and has overcome a discontinuous section which may be generated due to a stepped structure, and thus may be protected from water and/or foreign matter infiltrated from the outside.

According to certain embodiments, as illustrated in FIG. 5D, the extension part 4321 of the bending part 432 may be attached to the metal sheet layer 450 through a first adhesive member T1 at the rear surface of the flexible display 400. The flexible substrate 4322 may be attached to the metal sheet layer 450 through a second adhesive member T2. For example, the first adhesive member T1, which is a tape member having a designated thickness, may play both a role of maintaining the bent state of the bending part 432 and a role of a spacer having a thickness for compensating for the height difference between the extension part 4321 and the flexible substrate 4322. The first adhesive member T1 and/or the second adhesive member T2 may be at least partially exposed outside, and thus may be formed of a waterproof member (e.g., a waterproof tape). According to an embodiment, the first adhesive member T1 may contain PET, PI, or a material in which close-type foam is combined with PET. The second adhesive member T2 may include a conductive tape for electrically connecting the ground of the flexible substrate 4322 to the metal sheet layer 450. Here, the second adhesive member T2 may have a function of compensating for the height difference between the extension part 4321 and the flexible substrate 4322.

According to certain embodiments, the control circuit 4321*a* disposed in the extension part 4321 may be protected by a cover member 485 attached to perform covering from at least a part of the flexible substrate 4322 to at least a portion of the extension part 4321. The control circuit 4321*a* may be disposed between the flexible substrate 4322 and a third adhesive member T3 that is disposed between the cover member 485 and the extension part 4321, and thus may be sealed. The third adhesive member T3 may be omitted when the size of the control circuit 4321*a* is small (e.g., when the distance between the control circuit 4321*a* and the bending part protection layer 4324 is long). In this case, a part of the cover member 485 may be bent and then directly attached to the extension part 4321. According to an embodiment, the third adhesive member T3 may be formed of a waterproof member (e.g., a waterproof tape). According to an embodiment, the third adhesive member T3 may be disposed between the bending part protection layer 4324 and the control circuit 4321*a*. According to an embodiment, the second waterproof member 482 may be attached to the outer surface of the cover member 485. In this case, the cover member 485 may be brought into direct contact with external water and/or foreign matter, and thus may be formed of a material itself having a waterproof structure. For example, the cover member 485 may include, as a conductive layer 4851, a conductive nonwoven fabric having irregularly disposed conductive fiber tissues to prevent infiltration of external water. In an embodiment, the conductive layer 4851 may include a conductive sheet containing conductive powder and having a waterproof close structure. In an alternate embodiment, the conductive layer 4851 may include a conductive tape.

According to certain embodiments, the cover member 485 may include the conductive layer 4851, a first layer 4852 laminated on one surface of the conductive layer 4851, and a second layer 4853 laminated on the other surface of the conductive layer 4851. The conductive layer 4851 may include a conductive nonwoven fabric having conductive fiber tissues, as described above, a metal thin film layer (e.g., a metal sheet layer), or a conductive tape. The first layer 4852 may include a black shielding layer as a layer disposed on the outer surface of the cover member 485. According to an embodiment, the first layer 4852 may protect, from radiation noise, the control circuit 4321*a* disposed on the flexible substrate 4322. According to an embodiment, the second layer 4853 may include an adhesive layer (e.g., a nonconductive layer) attached to at least a part of each of the extension part 4321 and the flexible substrate 4322. The second layer 4853 may be disposed to overlap at least a part of the conductive layer 4851, and thus may shield static electricity (ESD) flowing to an unnecessary region through the conductive layer 4851. The conductive layer 4851 of the cover member 485 may be electrically connected to the flexible substrate 4322 in the illustrated direction of arrow, and the flexible substrate 4322 may be electrically connected to a printed circuit board (e.g., the second substrate assembly 162 in FIG. 3) of the electronic device 100. Therefore, the conductive layer 4851 may be electrically connected to a ground (G) of the printed circuit board (e.g., the second substrate assembly 162 in FIG. 3).

Figure 6B:
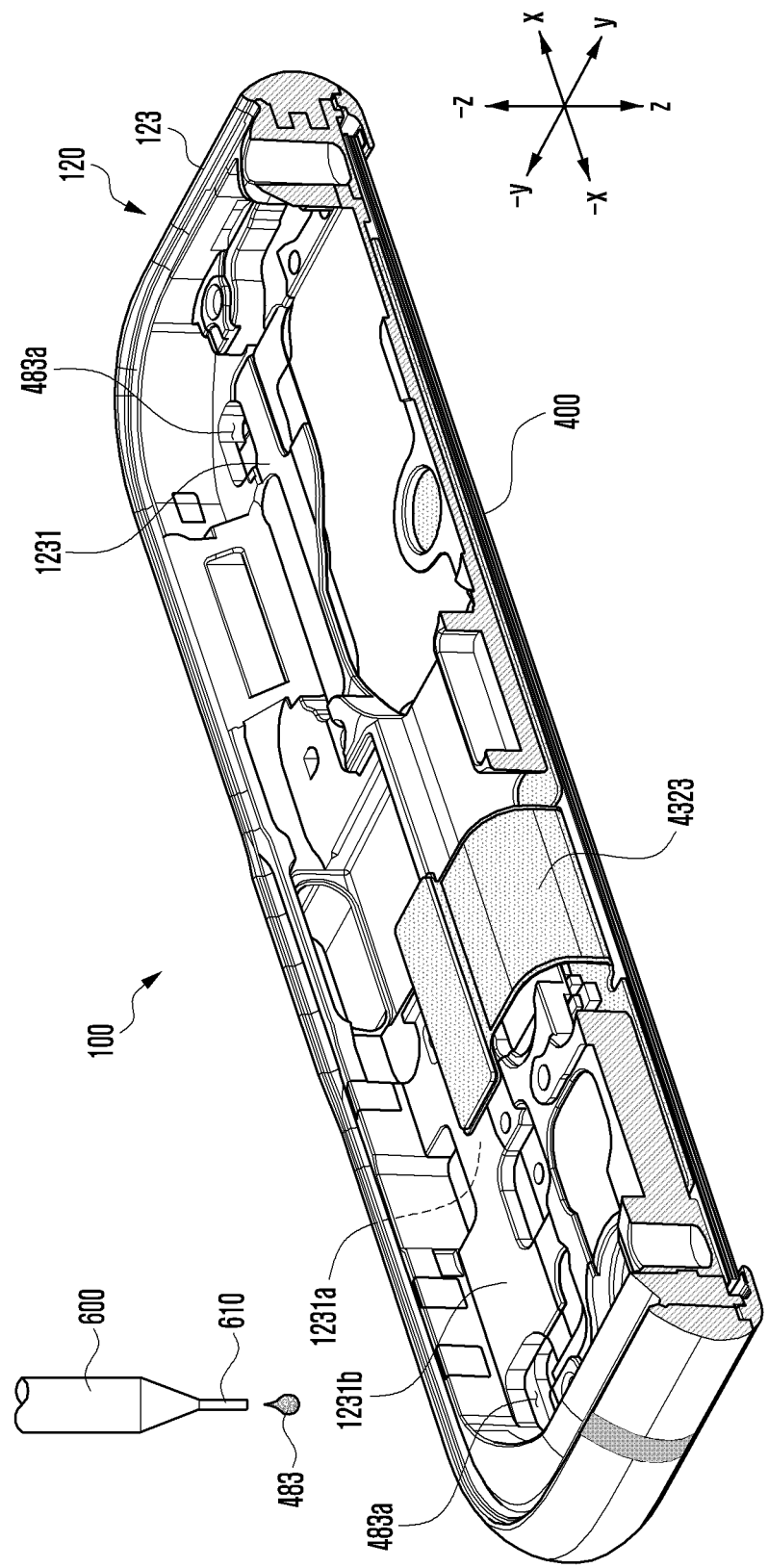
FIG. 6B is a perspective view of the cross-section of a second side member seen along line 6b-6b in FIG. 6A according to certain embodiments of the disclosure.

According to certain embodiments, the third waterproof members 483 connecting the first waterproof member 481 to the second waterproof member 482 may be injected through through-holes 483*a*, formed in a second support member (e.g., the second support member 1231 in FIG. 6A), by using a needle (e.g., the needle 610 in FIG. 6B) of a dispenser (e.g., the dispenser 600 in FIG. 6B). When the rear surface of the flexible display 400 is seen from above, the second waterproof member 482 viewed through the through holes 483*a*, the cover member 485 disposed beneath the second waterproof member, the extension part 4321 disposed beneath the cover member, and the first adhesive member T1 disposed beneath the extension part may be disposed to have a step in order to uniformly apply the third waterproof member. Here, the step may imply a stepped structure in which the first waterproof member 481, the second waterproof member 482, the cover member 485, the extension part 4321, and the first adhesive member T1 are disposed such that the edges thereof are at least partially viewable when the rear surface of the flexible display 400 is seen from above through the through-holes 483a. The first waterproof member 481, the second waterproof member 482, the cover member 485, the extension part 4321, and the first adhesive member T1 may be disposed such that the edges thereof correspond to each other. According to an embodiment, at least a part of the cover member 485 laminated above the extension part 4321 may include an exposed region 4805 in which the conductive layer 4851 is exposed. The conductive layer 4851 may be exposed to be viewable from the through-holes 483a by partially omitting the first layer 4852 of the cover member 485 and/or the second waterproof member 482. In this case, after a needle (e.g., the needle 610 in FIG. 6B) enters the through-holes 483a, the first adhesive member T1, the extension part 4321, the cover member 485, and the second waterproof member 482, which are viewed through the through-holes 483a may be connected to each other through the first waterproof member 481 and the third waterproof members 483 injected from the needle (e.g., the needle 610 in FIG. 6B). According to an exemplary embodiment of the disclosure, when the needle (e.g., the needle 610 in FIG. 6B) formed of a conductive material is excessively inserted into the through-holes 483a, the conductive layer 4851, electrically connected to a ground (G) of the cover member 485 disposed relatively closer to the needle (e.g., the needle 610 in FIG. 6B) (higher) than the extension part 4321 of the display panel 430, may be first brought into contact with the needle, thereby stopping an operation of the needle (e.g., the needle 610 in FIG. 6B). Therefore, additional occurrence of a large number of defective products can be reduced through an operation of detection of the needle (e.g., the needle 610 in FIG. 6B). In an embodiment, when the through-holes 483a are seen from above, the conductive layer 4851 may extend to a position in which the same overlaps the extension part 4321.

Figure 5E:
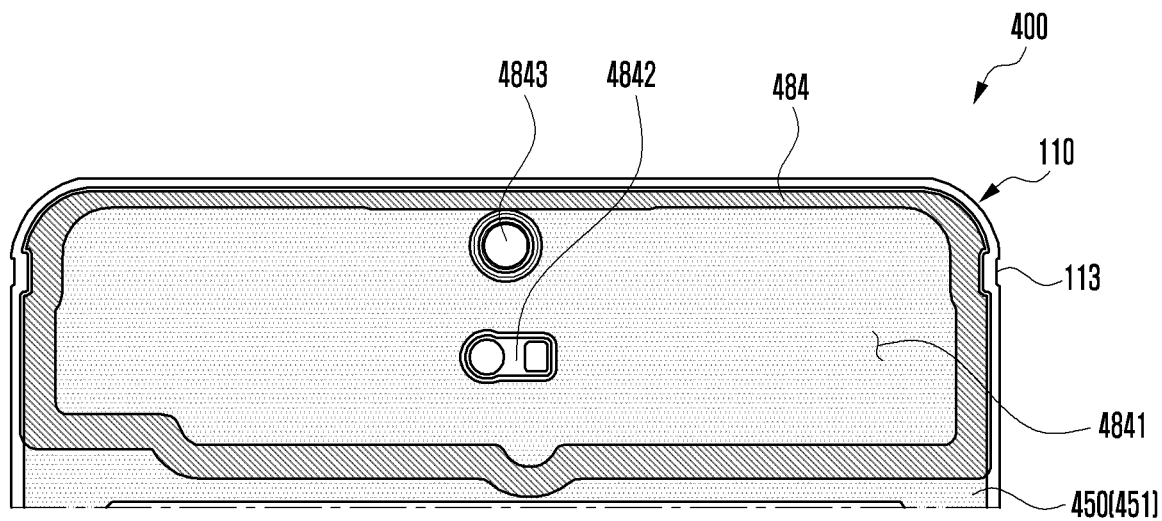
FIG. 5E illustrates a configuration of a part of a flexible display in which a fourth waterproof member according to certain embodiments of the disclosure is disposed.

FIG. 5E illustrates a configuration of a part of a flexible display in which a fourth waterproof member according to certain embodiments of the disclosure is disposed.

Referring to FIG. 5E, the electronic device 100 may include a fourth waterproof member 484 disposed between a metal sheet layer 450 of a flexible display 400 and the first support member 1131 and having a closed loop shape. The fourth waterproof member 484 may provide a sealed second waterproof space 4841. The electronic device 100 may include at least one electronic component disposed in a first disposition region 4843 and a second disposition region 4842, which are arranged in the first support member 1131 corresponding to the second waterproof space 4841. According to an embodiment, the at least one electronic component may include a camera device (e.g., the camera device 105 in FIG. 1A), disposed in the first disposition region 4843, and a sensor module (e.g., the sensor module 104 in FIG. 1A), disposed in the second disposition region 4842. Therefore, the at least one electronic component may be disposed in the second waterproof space 4841 formed to be sealed by the metal sheet layer 450 of the flexible display 400, the fourth waterproof member 484, and the first support member 1131, and thus may be protected from external water and/or foreign matter.

FIG. 6A illustrates a configuration of an electronic device from which a first rear cover and a second rear cover according to Certain embodiments of the disclosure have been removed. FIG. 6B is a perspective view of the cross-section of a second side member seen along line 6b-6b in FIG. 6A according to certain embodiments of the disclosure.

Referring to FIGS. 6A and 6B, the flexible substrate 4322 of the bending part 432 may include a connector 4323 extending to a designated length. As shown, the connector 4323 may be electrically connected to a substrate 162 (e.g., the second substrate assembly 162 in FIG. 3) disposed to face the fourth support surface 1231b of the second support member 1231. Therefore, when the flexible display 400 is seen from above, the connector 4323 may penetrate the second support member from the third support surface 1231a to the fourth support surface 1231b at a position in which the same overlaps the first waterproof space 4813, and then electrically connected to a substrate 162, and thus may receive the benefits of a waterproof function of the first waterproof space 4813 formed by the first waterproof member 481, the second waterproof member 482, and the third waterproof members 483. In an embodiment, the first waterproof space 4813 may be formed in an at least partially opened loop shape. In this case, a partially opened part may be closed by a structural change of a housing and/or another electronic component. When the connector 4323 is disposed across the first waterproof member 481 and/or the second waterproof member 482, which are sealed, a corresponding part of the first waterproof member 481 and/or the second waterproof member 482 may have a thickness different from that of peripheral parts, thereby contributing to forming a sealed structure. Here, the corresponding part may be formed to be thinner or thicker than the peripheral part.

Figure 6C:
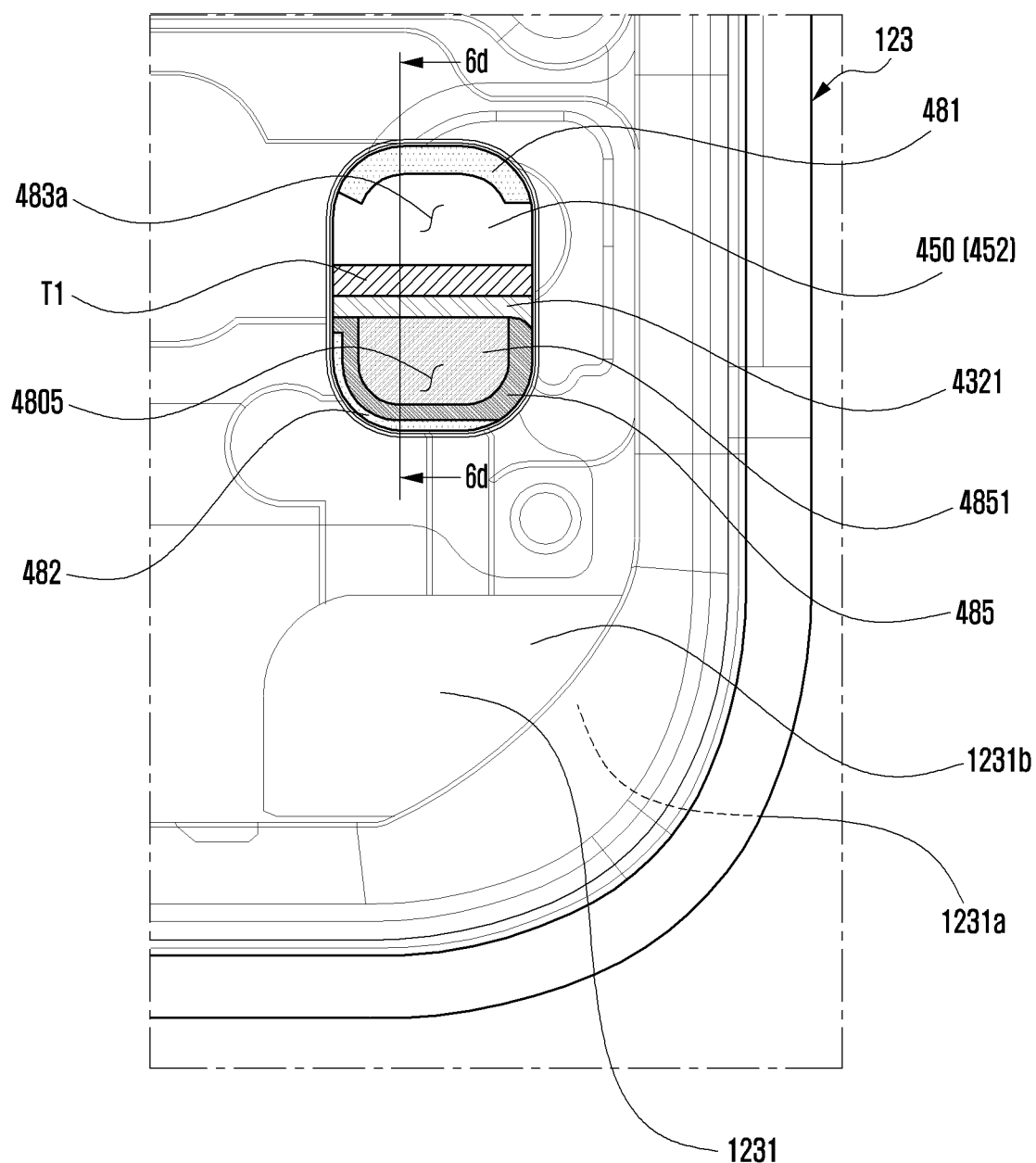
FIG. 6C is an enlarged view of a region of line 6c in FIG. 6A according to certain embodiments of the disclosure.
Figure 6D:
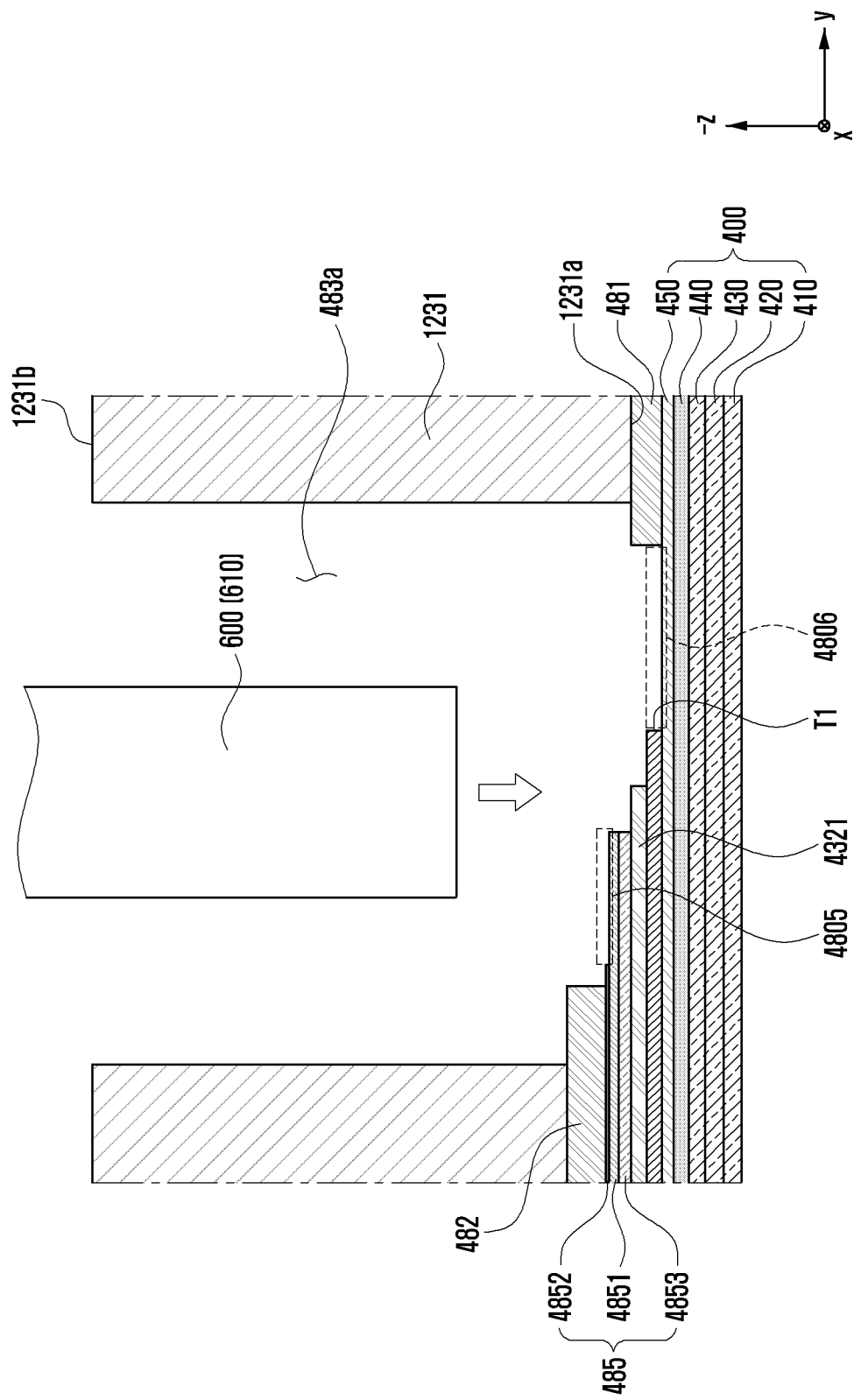
FIG. 6D is a partial cross-section view of an electronic device seen along line 6d-6d in FIG. 6C according to certain embodiments of the disclosure.

FIG. 6C is an enlarged view of a region of line 6c in FIG. 6A according to certain embodiments of the disclosure. FIG. 6D is a partial cross-section view of an electronic device seen along line 6d-6d in FIG. 6C according to certain embodiments of the disclosure.

Referring to FIGS. 6C and 6D, the second support member 1231 may include a third support surface 1231a facing a first direction (the z-axis direction), and a fourth support surface 1231b facing a second direction (the −z-axis direction) opposite to the first direction. The second support member 1231 may include a through-hole 483a formed therethrough from the fourth support surface 1231b to the third support surface 1231a. When the fourth support surface 1231b is seen from above, the through-hole 483a may be disposed at a position overlapping a discontinuous section which the fourth support surface 1231b is cut by stepped parts of the first waterproof member 481 and the second waterproof member 482. According to an embodiment, after a needle 610 of a dispenser 600) is partially inserted into the through-hole, a third waterproof members 483 may be applied, through the needle 610, in a liquid or semi-solid form to the through-hole 483a, including the discontinuous section formed by the stepped part, from the fourth support surface 1231b toward the third support surface 1231a (direction ①), and then may be solidified. In this case, the solidified third waterproof members 483 may connect the first waterproof member 481 to the second waterproof member 482, and after being cured, may be at least partially fixed to the second support member 1231, thereby contributing to forming the sealed first waterproof space 4813.

According to certain embodiments, when the third waterproof members 483 are injected through the through-hole 483a, the edge of the flexible display 400 viewed through the through-holes 483a should be filled with the third waterproof members 483 without any space so that a waterproof function can be improved. Therefore, the first adhesive member T1, the extension part 4321, the cover member 485, and the second waterproof member 482 of the flexible display 400, exposed through the through-hole 483a, may be disposed to have a step from the fourth support surface 1231b toward the third support surface 1231a (e.g., in the z-axis direction).

According to certain embodiments, at least a part of the cover member 485, disposed to be visually viewable through the through-hole 483a, may include an exposed region 4805 in which a conductive layer 4851 is exposed. The conductive layer 4851 of the cover member 485 may be disposed at a position relatively close to the needle 610, inserted into the through-holes 483a, compared with the extension part 4321 of the display panel 430. Therefore, even when the needle 610 malfunctions and is excessively inserted into the through-hole 483a, the conductive layer 4851, electrically connected to a ground (G) used as a probing point, is first brought into contact with the needle 610, and as a result, the operation of the needle 610 may be stopped to prevent further defective products. In operation, even when the diameter of the needle 610 inserted into the through-hole 483a is relatively smaller, a response region 4806 of the metal sheet layer 450 (or a reinforcement plate (e.g., the reinforcement plate 470 in FIG. 4), disposed close to the needle 610 compared with the display panel 430, is first brought into contact with the needle 610, and thus the operation of the needle 610 is stopped, thereby preventing additional defective products.

It should be noted that the waterproof structure and the electricity-conducting structure for detecting excessive insertion of the needle 610, according to certain embodiments of the disclosure, have been applied to the foldable electronic device 100 including the flexible display 400, but are not limited thereto. For example, the teachings of present structures can also be applied to a bar-type electronic device including a display or a rollable electronic device (e.g., a slidable electronic device) in which two housings slidably operate toward each other, thereby varying the area of a display area.

Figure 7A:
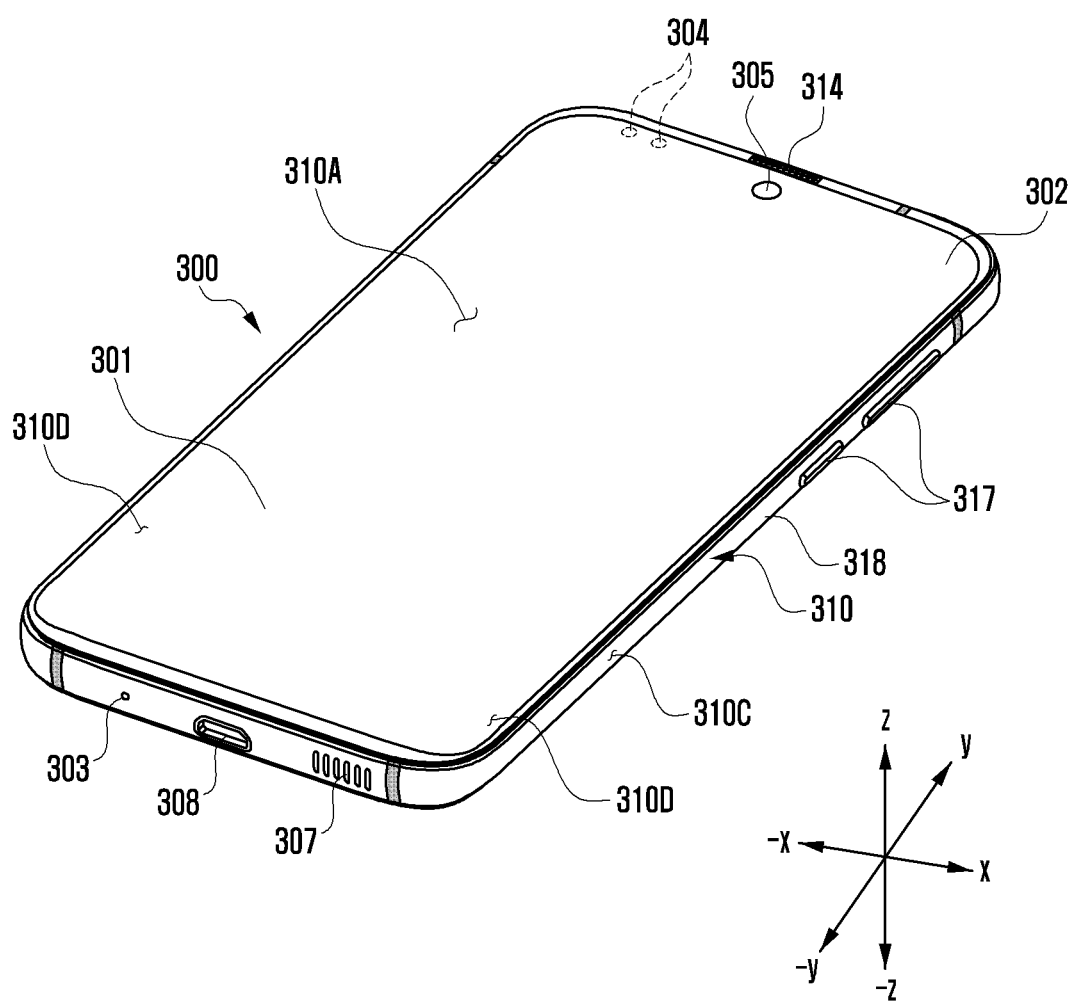
FIG. 7A is a perspective view of the front surface of an electronic device according to certain embodiments of the disclosure.
Figure 7B:
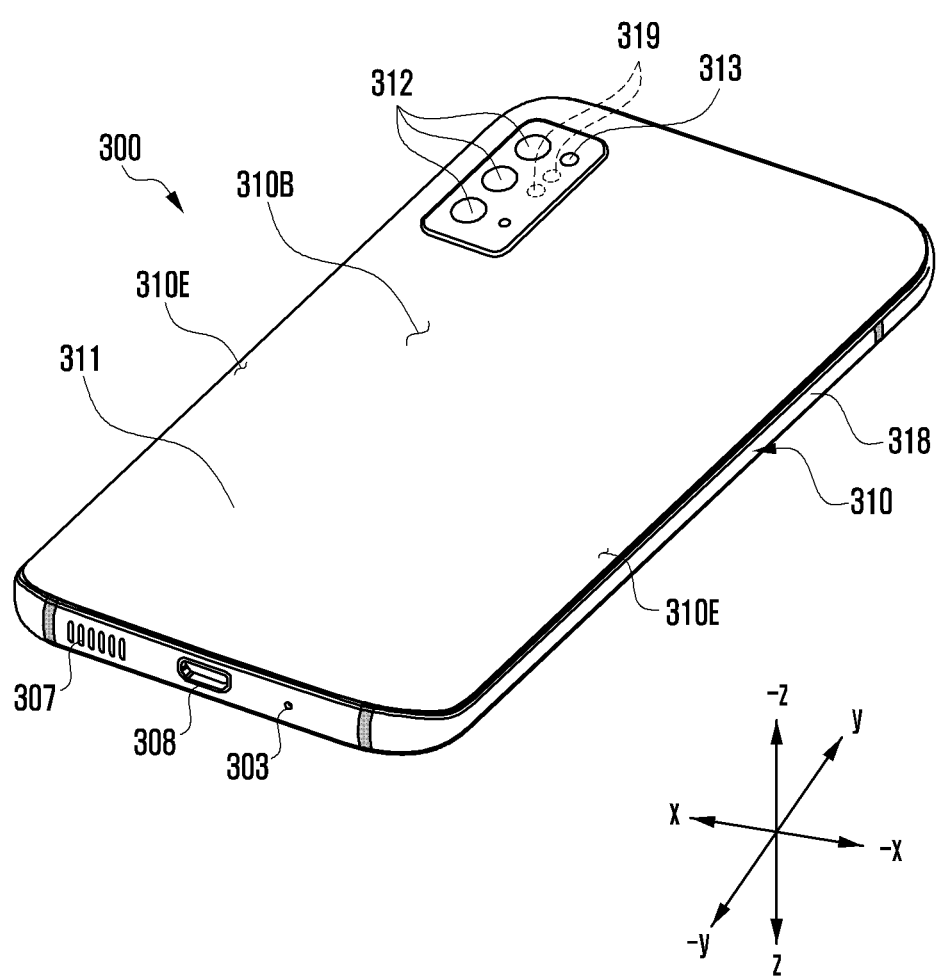
FIG. 7B is a perspective view of the rear surface of the electronic device in FIG. 7A according to certain embodiments of the disclosure.

FIG. 7A is a perspective view of the front surface of an electronic device 300 (e.g., a mobile electronic device) according to certain embodiments of the disclosure. FIG. 7B is a perspective view of the rear surface of the electronic device 300 in FIG. 7A according to certain embodiments of the disclosure.

Referring to FIGS. 7A and 7B, the electronic device 300 according to an embodiment may include a housing 310 which includes a first surface (or a front surface) 310A, a second surface (or a rear surface) 310B, and a side surface 310C surrounding a space between the first surface 310A and the second surface 310B. In another embodiment (not shown), the housing may refer to a structure forming some among the first surface 310A, the second surface 310B, and the side surface 310C in FIG. 7A. As shown, the first surface 310A may be at least partially formed of a substantially transparent front plate 302 (e.g., a polymer plate, or a glass plate including various coating layers). The second surface 310B may be formed of a substantially opaque rear plate 311. The rear plate 311 may be formed of, for example, coated or colored glass, ceramic, polymer, metal (e.g., aluminum, stainless steel (STS), or magnesium), or a combination of at least two of the materials. The side surface 310C may be coupled to the front plate 302 and the rear plate 311, and may be formed of a side bezel structure 318 (or "side member") containing metal and/or polymer. In an embodiment, the rear plate 311 and the side bezel structure 318 may be integrally formed, and may contain an identical material (e.g., a metal material such as aluminum).

In the illustrated embodiment, the front plate 302 may include a first region 310D, which is bent and seamlessly extends from the first surface 310A toward the rear plate, at both ends of long edges of the front plate. Referring to FIG. 7B, the rear plate 311 may include a second region 310E, which is bent and seamlessly extends from the second surface 310B toward the front plate, at both ends of the long edges thereof. The front plate 302 or the rear plate 311 may include only one of the first region 310D or the second region 310E. The front plate 302 may include only a flat surface disposed parallel to the second surface 310B without including the first region and the second region. In the embodiments, when the electronic device is seen from the side surface of the electronic device, the side bezel structure 318 may have a first thickness (or width) at a side surface which does not include the first region 310D or the second region 310E as described above, and may have a second thickness smaller than the first thickness at a side surface which includes the first region 310D or the second region 310E.

According to an embodiment, the electronic device 300 may include at least one among a display 301, an input device 303, sound output devices 307 and 314, sensor modules 304 and 319, camera modules 305 and 312, key input devices 317, an indicator (not shown), and a connector 308. It should be noted that the electronic device 300 may omit at least one (e.g., the key input device 317 or the indicator) of the elements, or may additionally include another element.

The display 301 may be visually exposed through, for example, a considerable part of the front plate 302. In an embodiment, at least a part of the display 301 may be exposed through the front plate 302 which forms the first surface 310A and the first region 310D of the side surface 310C. The display 301 may be coupled to or disposed adjacent to a touch sensing circuit, a pressure sensor capable of measuring the strength (pressure) of touch, and/or a digitizer for detecting a stylus pen using a magnetic field. In an embodiment, at least some of the sensor modules 304 and 319 and/or at least a part of the key input devices 317 may be disposed in the first region 310D and/or the second region 310E.

The input device 303 may include a microphone 303. The input device 303 may include multiple microphones 303 disposed to sense the direction of sound. The sound output devices 307 and 314 may include speakers 307 and 314. The speakers 307 and 314 may include an external speaker 307 and a call receiver 314. In an embodiment, at least some of the microphone 303, the speakers 307 and 314, and the connector 308 may be disposed in the inner space of the electronic device 300, and may be exposed to an external environment through at least one hole formed in the housing 310. The hole formed in the housing 310 may be commonly used for the microphone 303 and the speakers 307 and 314. The sound output devices 307 and 314 may include a speaker (e.g., a piezo speaker) operating while the hole formed in the housing 310 is excluded.

The sensor modules 304 and 319 may generate an electrical signal or a data value, which corresponds to an operation state inside the electronic device 300 or the outside environment state The sensor modules 304 and 319 may include, for example, first sensor modules 304 (e.g., proximity sensors) and/or a second sensor module (not shown) (e.g., fingerprint sensors), disposed in the first surface 310A of the housing 310, and/or third sensor modules 319 (e.g., HRM sensors) disposed in the second surface 310B of the housing 310. The fingerprint sensors may be disposed below the first surface 310A (e.g., a home key button) of the housing 310, a partial region of the second surface 310B, and/or the display 301. The electronic device 300 may further include at least one of unillustrated sensor modules, for example, a gesture sensor, a gyro sensor, a barometric sensor, a magnetic sensor, an acceleration sensor, a grip sensor, a color sensor, an infrared (IR) sensor, a biosensor, a temperature sensor, a humidity sensor, a proximity sensor, or an illuminance sensor.

The camera modules 305 and 312 may include a first camera module 305, disposed in the first surface 310A of the electronic device 300, and second camera modules 312 and/or a flash 313, disposed in the second surface 310B. The camera modules 305 and 312 may include one or multiple lenses, image sensors, and/or image signal processors. The flash 313 may include, for example, a light-emitting diode or a xenon lamp. In an embodiment, at least two lenses (a wide-angle lens, an ultra-wide angle lens, or a telephoto lens) and image sensors may be disposed in one surface of the electronic device 300.

The key input devices 317 may be disposed in the side surface 310C of the housing 310. In another embodiment, the electronic device 300 may not include some or all of the above-described key input devices 317, and key input devices 317, which are not included, may be implemented in another form such as a soft key on the display 301. In another embodiment, the key input devices 317 may be implemented using a pressure sensor included in the display 301.

The indicator may be disposed in, for example, the first surface 310A of the housing 310. The indicator may provide state information of the electronic device 300 in the form of light (e.g., by a light-emitting element). In another embodiment, the light-emitting element may provide, for example, a light source operating in conjunction with an operation of the first camera module 305. The indicator may include, for example an LED, an IR LED, and/or a xenon lamp.

The connector hole 308 may include a first connector hole 308 capable of receiving a connector (e.g., a universal serial bus (USB) connector) for transmitting or receiving power and/or data to or from an external electronic device, and/or a second connector hole (or an earphone jack) (not shown) capable of receiving a connector for transmitting or receiving an audio signal to or from the external electronic device.

Some camera modules 305 among camera modules 305 and 312, some sensor modules 304 among the sensor modules 304 and 319, or the indicator may be disposed to be exposed through the display 301. For example, the first camera module 305, the first sensor modules 304, or the indicator may be disposed to be exposable to an external environment through an opening or a transmissive region of the display 301 in the inner space of the electronic device 300, wherein the opening is formed through the display 301 to the front plate 302. According to an embodiment, a region in which the display 301 faces the first camera module 305 may be a part of a region for displaying contents, and may be formed as a transmissive region having a predetermined transmissivity. According to an embodiment, the transmissive region may be formed to have transmissivity of a range of about 5% to about 20%. The transmissive region may include a region overlapping an effective aperture (e.g., a field of view) of the first camera module 305, through which light for generating an image by being imaged by an image sensor passes. For example, the transmissive region of the display 301 may include a region having a lower pixel density than an ambient region. Here, the transmissive region may replace the opening. The first camera module 305 may include an under display camera (UDC). In another embodiment, some sensor modules 304 may be disposed to perform functions thereof in the electronic device without being visually exposed through the front plate 302. For example, in this case, a region of the display 301, facing the sensor modules, may not require an opening formed therethrough.

According to certain embodiments, the electronic device 300 has a bar-type or plate-type exterior, but the disclosure is not limited thereto. For example, the illustrated electronic device 300 may be a part of "a foldable electronic device", "a slidable electronic device", "a stretchable electronic device", and/or "a rollable electronic device". The "foldable electronic device", the "slidable electronic device", the "stretchable electronic device", and/or the "rollable electronic device" may refer to an electronic device in which bending deformation of a display (e.g., a display 500 in FIG. 8) is possible, and thus at least a part thereof can be folded, wound, or rolled, or the region thereof can be at least partially enlarged and/or received in a housing (e.g., the housing 310 in FIGS. 7A and 7B). In the foldable electronic device, the slidable electronic device, the stretchable electronic device, and/or the rollable electronic device, a screen display region can be enlarged and used by unfolding a display or exposing a wider area of the display outside, depending on a user's needs.

Figure 8:
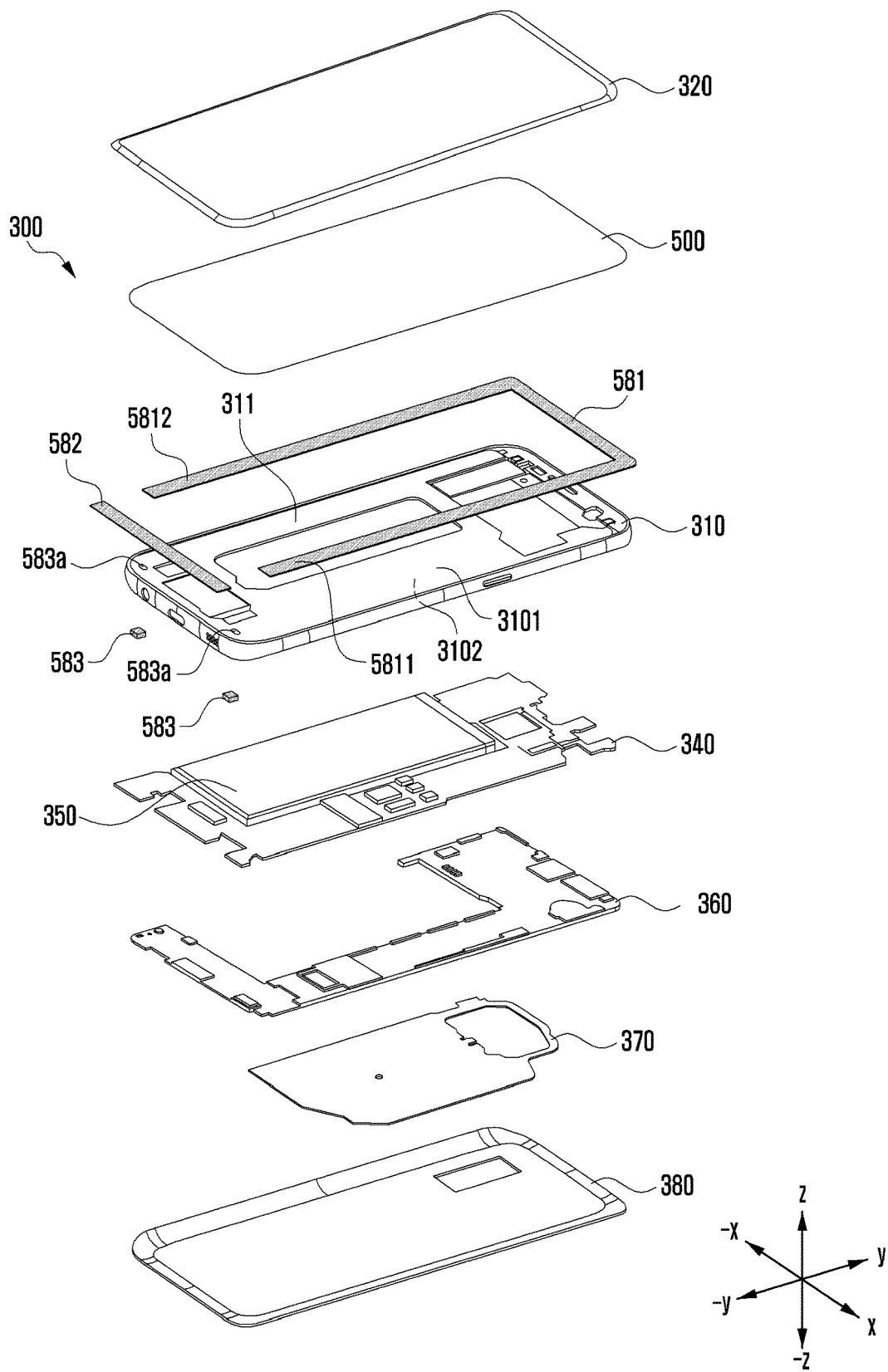
FIG. 8 is an exploded perspective view of the electronic device in FIG. 7A according to certain embodiments of the disclosure.

FIG. 8 is an exploded perspective view of the electronic device 300 in FIG. 7A according to certain embodiments of the disclosure.

The electronic device 300 in FIG. 8 may be at least partially similar to the electronic device 300 in FIGS. 7A and 7B, or may further include another embodiment of the electronic device.

Referring to FIG. 8, the electronic device 300 (e.g., the electronic device 300 in FIG. 7A or 7B) may include a side member 310 (e.g., a side bezel structure), a first support member 311 (e.g., a bracket or support structure), a front plate 320 (e.g., a front cover), a display 500, a printed circuit board 340, a battery 350, a second support member 360 (e.g., a rear case), an antenna 370, and a rear plate 380 (e.g., a rear cover). In an embodiment, the electronic device 300 may omit at least one (e.g., the first support member 311 or the second support member 360) of the elements, or may additionally include other element. At least one of the elements of the electronic device 300 may be identical or similar to at least one of the elements of the electronic device 300 in FIG. 7A or 7B, and a redundant description thereof will be omitted below.

The first support member 311 may be disposed in the electronic device 300 and connected to the side member 310, or may be formed integrally with the side member 310. The first support member 311 may be formed of, for example, metal material and/or a nonmetal (e.g., polymer) material. The first support member 311 may have one surface coupled to the display 500, and the other surface coupled to the printed circuit board 340. A processor, a memory, and/or an interface may be mounted on the printed circuit board 340. The processor may include at least one among, for example, a central processing unit, an application processor, a graphics processing device, an image signal processor, a sensor hub processor, or a communication processor.

The memory may include, for example, volatile memory or nonvolatile memory.

The interface may include, for example, a high definition multimedia interface (HDMI), a universal serial bus (USB) interface, an SD card interface, and/or an audio interface. The interface, for example, may electrically or physically connect the electronic device 300 to an external electronic device, and may include a USB connector, an SD card/MMC connector, or an audio connector.

The battery 350 is a device for supplying power to at least one element of the electronic device 300, and may include, for example, a non-rechargeable primary battery, a rechargeable secondary battery, or a fuel cell. At least a part of the battery 350 may be disposed on a substantially identical plane together with, for example, the printed circuit board 340. The battery 350 may be integrally disposed in the electronic device 300. In another embodiment, the battery 350 may be disposed to be attached to or detached from the electronic device 300.

The antenna 370 may be disposed between the rear plate 380 and the battery 350. The antenna 370 may include, for example, a near field communication (NFC) antenna, a wireless charging antenna, and/or a magnetic secure transmission (MST) antenna. For example, the antenna 370 may perform near field communication with an external device, or may wirelessly transmit or receive power for charging. In another embodiment, an antenna structure may be formed of a part of the side member 310 and/or the first support member 311 or a combination thereof.

According to certain embodiments, the first support member 311 of the side member 310 may include a first surface 3101 facing the front plate 320, and a second surface 3102 facing a direction opposite to the direction faced by the first surface 3101 (e.g., a rear plate direction). The electronic device 300 may include at least one waterproof member 581, 582, or 583 for protecting electronic components disposed in the inner space thereof from external water and/or foreign matter. According to an embodiment, the at least one waterproof member 581, 582, or 583 may include a first waterproof member 581 disposed between the display 500 and the first surface 3101 of the first support member 311, a second waterproof member 582 disposed between an extension part (e.g., an extension part 5311a in FIG. 9) of the display 500 and the first surface 3101 of the first support member 311 and disposed adjacent to the first waterproof member 581, and at least one third waterproof member 583 connecting one end 5811 of the first waterproof member 581 to the second waterproof member 582 and connecting the other end 5812 of the first waterproof member 581 to the second waterproof member 582. As described above, the third waterproof member 583 may be injected from the second surface 3102 through at least one through-hole 583a formed in the first support member 311 in a state in which the display 500 is attached to the first surface 3101 of the first support member 311 through the first waterproof member 581 and the second waterproof member 582. According to an embodiment, the third waterproof member 583 in a liquid or semi-solid state may be applied and cured through the needle (e.g., the needle 610 in FIG. 6B) of a dispenser (e.g., the dispenser 600 in FIG. 6B) inserted into the through-hole 583a toward the first surface 3101 (in the z-axis direction) from the second surface 3102 of the first support member 311. According to an embodiment, the first waterproof member 581 and the second waterproof member 582 may include a tape member. According to an embodiment, the third waterproof member 583 may include cured-in-place gaskets (CIPG). Therefore, the electronic device 300 may include a sealed space (e.g., a sealed space 5813 in FIG. 10A) formed such that the edge of the electronic device 300 is substantially surrounded in a closed loop shape by the first waterproof member 581, the second waterproof member 582, and the third waterproof member 583.

Figure 9:
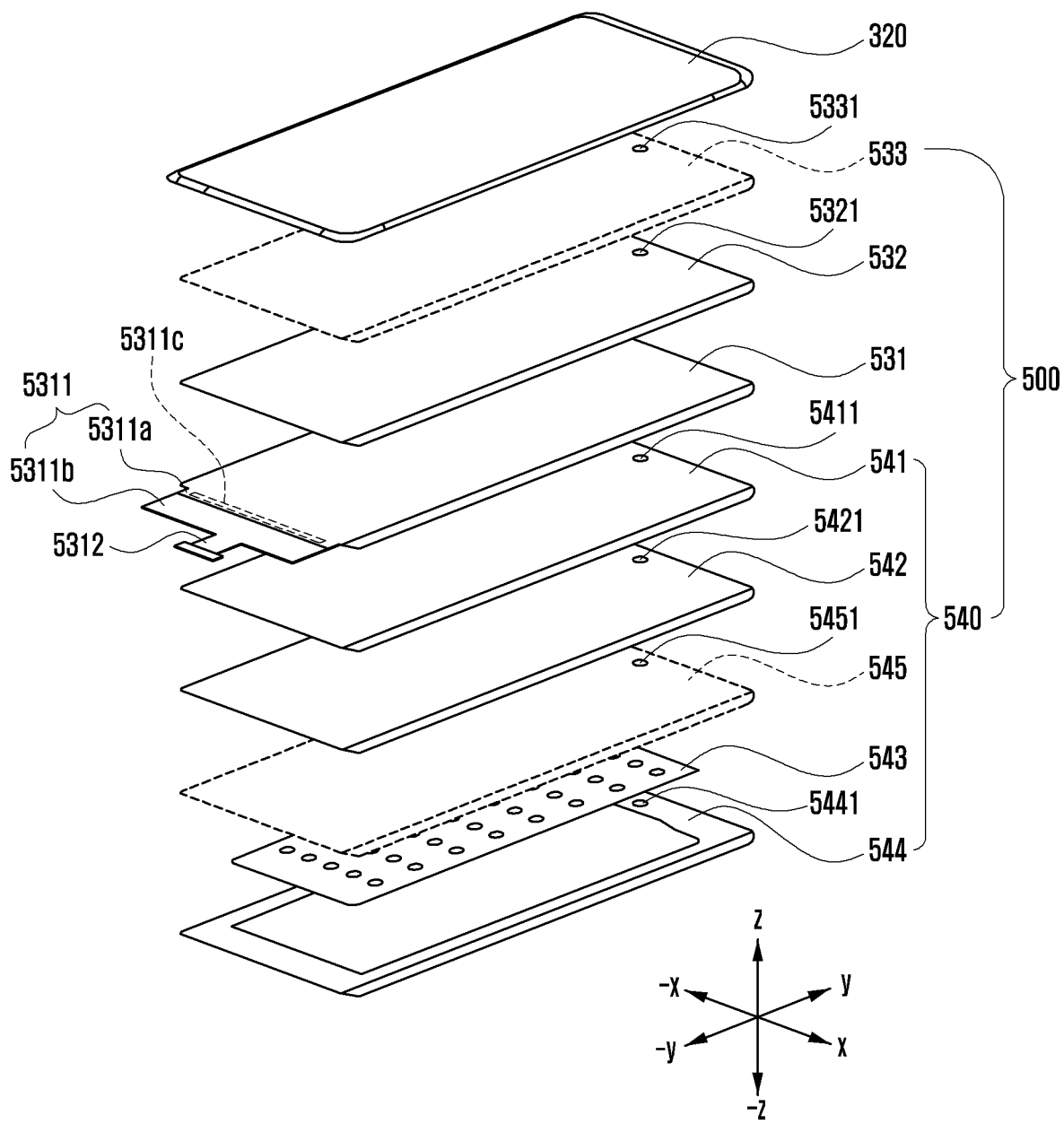
FIG. 9 is an exploded perspective view of a display according to certain embodiments of the disclosure.

Hereinafter, the structure of the display 500 of the electronic device 300 will be described in detail FIG. 9 is an exploded perspective view of a display according to Certain embodiments of the disclosure.

The display 500 in FIG. 9 may be at least partially similar to the display 301 in FIG. 7A, or may further include additional elements of the display.

Referring to FIG. 9, the display 500 may include a polarizer (POL) 532 (e.g., a polarizing film or a polarizing layer), a display panel 531, and at least one subsidiary material layer 540 attached to the rear surface of the display panel 531, which are sequentially disposed on the rear surface (e.g., the −z-axis direction) of a front cover 320 (e.g., a front plate, a glass plate, a first cover member, or a cover member) through an adhesive member. Alternatively, the display panel 531 and the POL 532 may be integrally formed.

According to certain embodiments, the display 500 may include a control circuit (not shown). The control circuit may include a flexible printed circuit board (FPCB), which electrically connects a main printed circuit board (e.g., the printed circuit board 340 in FIG. 3) of an electronic device (e.g., the electronic device 300 in FIG. 3) to the display panel 531, and a display driver IC (DDI) mounted on the FPCB. According to an embodiment, the display 500 may additionally include a touch panel 533. When the display 500 operates as an in-cell or on-cell touch display depending on the placement position of the touch panel 533, the control circuit may include a touch display driver IC (TDDI). In another embodiment, the display 500 may include a fingerprint sensor (not shown) disposed around the control circuit. According to an embodiment, the fingerprint sensor may include an ultrasonic or optical fingerprint sensor capable of recognizing a fingerprint of a finger, which approaches or is touched from the outer surface of the front cover 320, through holes at least partially formed in some elements among the elements of the display 500.

According to certain embodiments, the at least one subsidiary material layer 540 may include at least one polymer member 541 or 542 disposed on the rear surface of the display panel 531, at least one functional member 543 disposed on the rear surface of the at least one polymer member 541 (or 542), and a conductive member 544 disposed on the rear surface of the at least one functional member 543. According to an embodiment, the at least one polymer member 541 (or 542) may include a light-shielding layer 541 (e.g., a black layer including an uneven pattern) for removing bubbles generated between the display panel 531 and members attached to the bottom thereof and shielding light generated by the display panel 531 or light entering from the outside. Alternatively, a cushion layer 542 may be disposed so as to lessen an impact. According to an embodiment, the at least one functional member 543 may include a heat-dissipation sheet (e.g., a graphite sheet) for dissipating heat, an added display, a force touch FPCB, a fingerprint sensor FPCB, a communication antenna radiator, a conductive/nonconductive tape, or an open cell sponge. According to an embodiment, the conductive member 544, which is a metal plate, may contribute to reinforcement of the rigidity of an electronic device (e.g., the electronic device 300 in FIG. 3), and may be used to shield ambient noise and dissipate heat radiated from peripheral heat-radiating components. According to an embodiment, the conductive member 544 may contain Cu, Al, Mg, SUS, or CLAD (e.g., a lamination member in which SUS and Al are alternately disposed). In another embodiment, the display 500 may further include a detection member 545 for detecting an input by an electromagnetic-induction writing member (e.g., an electronic pen). The detection member 545 may include a digitizer. According to an embodiment, the detection member 545 may be disposed between the at least one polymer member 542 and the functional member 543. In another embodiment, the detection member 545 may be disposed between the display panel 531 and the at least one polymer member 541. In yet another embodiment, the detection member 545 may be disposed on the rear surface of the conductive member 544.

According to certain embodiments, the subsidiary material layer 540 may include openings 5411, 5421, 5451, and 5441 formed at a position corresponding to a camera module (e.g., the camera module 305 in FIG. 7A). The camera module 305 may be disposed close to the rear surface of the display panel 531 through the openings 5411, 5421, 5451, and 5441. According to an embodiment, the POL 532 or the touch panel 533, disposed on the top of the display panel 531, may also include openings 5321 and 5331 by being perforated at corresponding positions in order to prevent the performance degradation of the camera module 305 due to a refractive index. In another embodiment, the POL 532 and/or the touch panel 533 may be transparently processed at positions corresponding to the camera module 305, or polarization properties thereof may be removed. In another embodiment, layers (e.g., the display panel 531) with no opening and/or the touch panel 533 may include coated layers capable of index matching for minimization of a refractive index difference. According to an embodiment, the display 500 may include organic light-emitting diode (an OLED) display or a liquid crystal display (LCD).

According to certain embodiments, the display 500 may include a bending part 5311 disposed to be folded from the display panel 531 to at least a partial region of the rear surface of the display 500. According to an embodiment, the bending part 5311 may include an extension part 5311a, which extends from the display panel 531 and includes a control circuit 5311c, and a flexible substrate, which is electrically connected to the extension part 5311a and includes multiple electrical elements. According to an embodiment, the control circuit 5311c may include a display driver IC (DDI) or a touch display driver IC (TDDI), mounted to the extension part 5311a having an electrical wiring structure. The control circuit 5311c may have a chip-on-panel or chip-on-plastic (COP) structure directly disposed in the extension part 5311a. In an embodiment, the control circuit 5311c may have a chip-on-film (COF) structure mounted to a separate connection film (not shown) for connecting the extension part 5311a to the flexible substrate 5311b. According to an embodiment, the display 500 may include multiple electrical elements disposed on the flexible substrate 5311b. The display 500 may include a connector 5312 extending from the flexible substrate 5311b and electrically connected to a substrate (e.g., the printed circuit board 340 in FIG. 8) of an electronic device (e.g., the electronic device 300 in FIG. 8). Here the multiple electrical elements may include a touch IC, a display flash memory, an ESD prevention diode, a pressure sensor, a fingerprint sensor, or a passive element such as decap (decoupling capacitor).

Figure 10A:
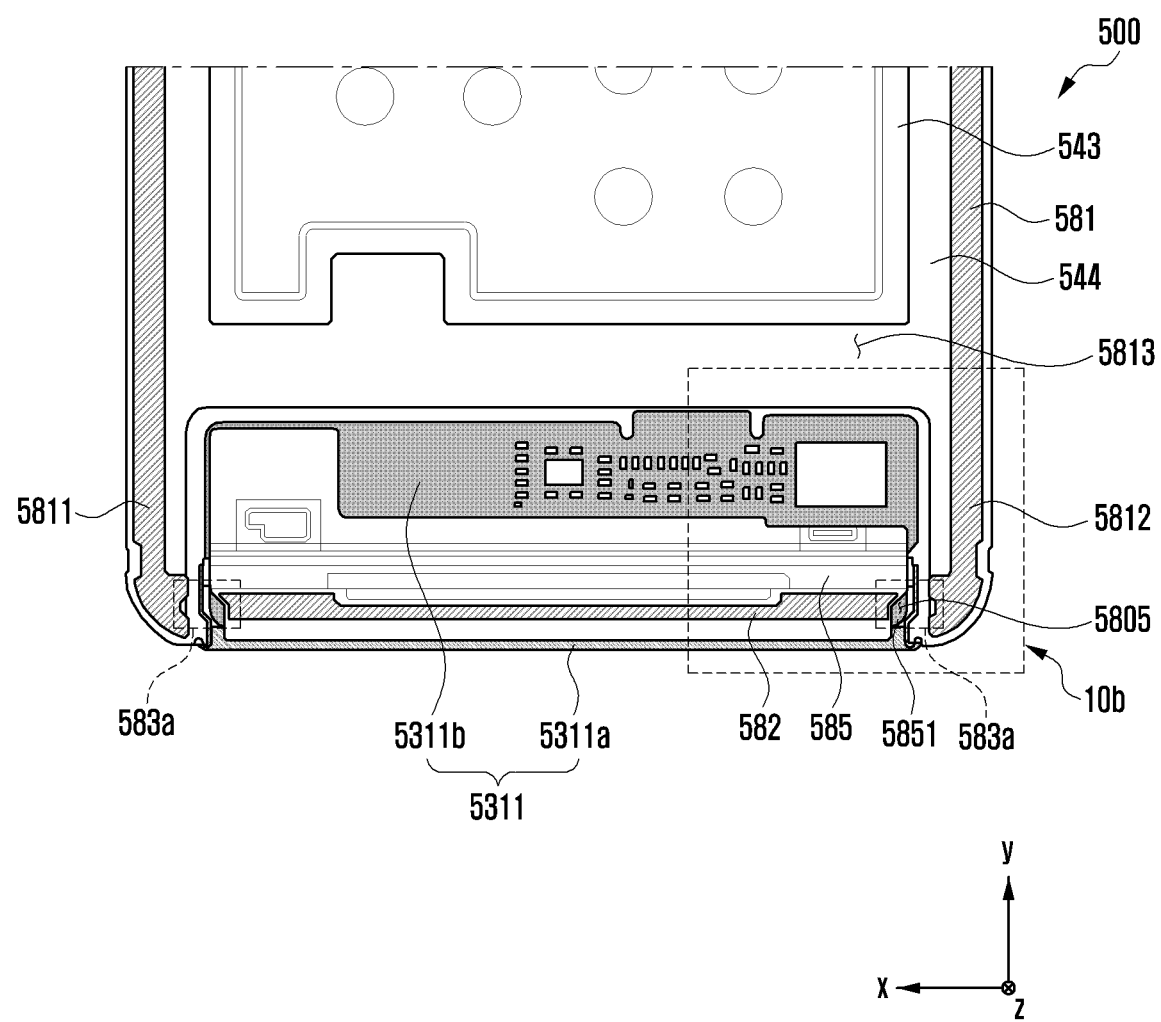
FIG. 10A illustrates a partial configuration of the rear surface of a display according to certain embodiments of the disclosure.
Figure 10B:
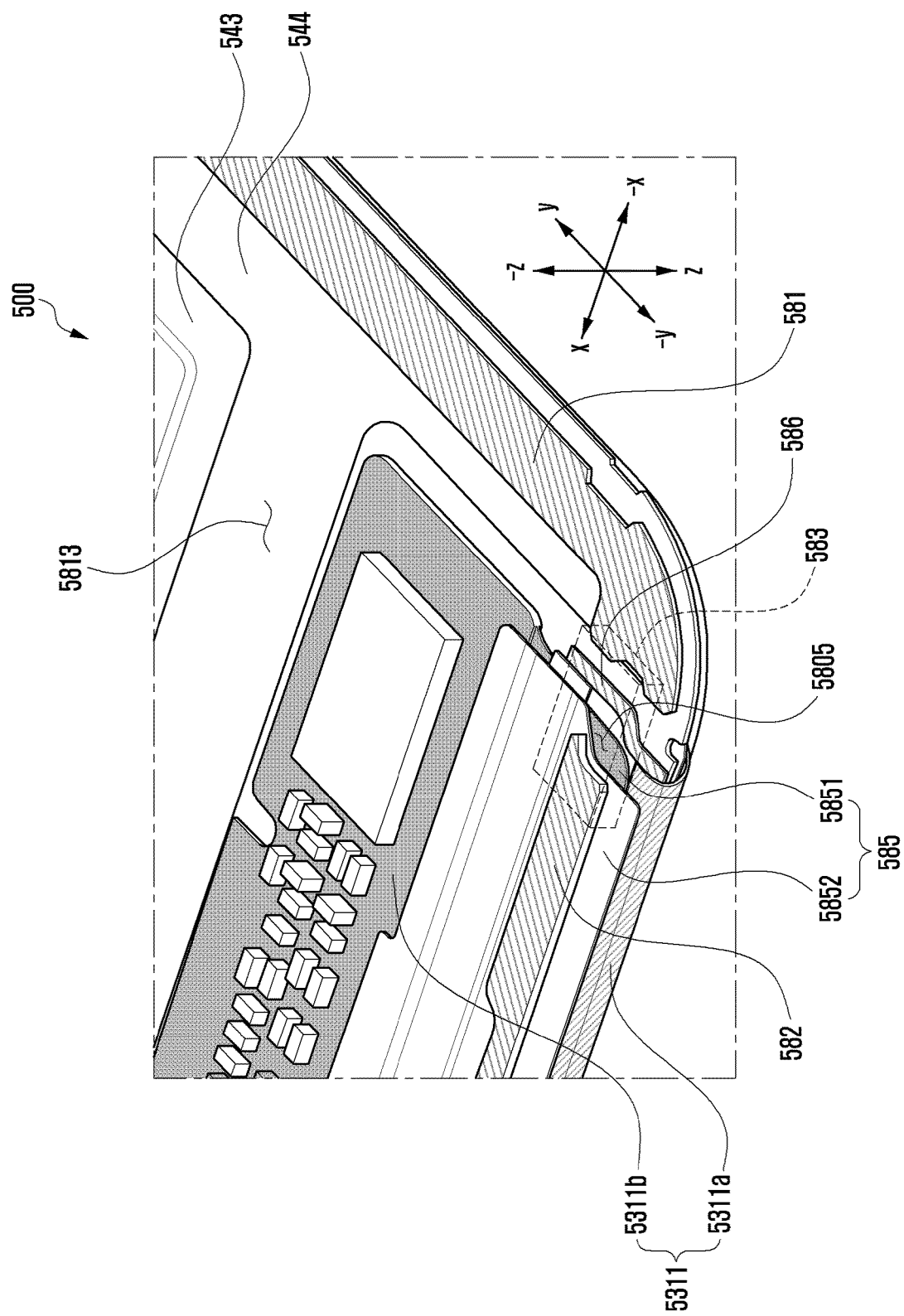
FIG. 10B is a partial perspective view of a display, enlarging a region 10b in FIG. 10A according to certain embodiments of the disclosure.

FIG. 10A illustrates a partial configuration of the rear surface of a display according to certain embodiments of the disclosure. FIG. 10B is a partial perspective view of a display, enlarging a region 10b in FIG. 10A according to certain embodiments of the disclosure.

Referring to FIGS. 10A and 10B, a third waterproof member 583 connecting a first waterproof member 581 to a second waterproof member 582 may be injected through a through-hole (e.g., the through-hole 583a in FIG. 8), formed in a first support member (e.g., the first support member 311 in FIG. 8), by using a needle (e.g., the needle 610 in FIG. 6B) of a dispenser (e.g., the dispenser 600 in FIG. 6B). According to an embodiment, when the rear surface of the display 500 is seen from above, the second waterproof member 582 viewed through the through-hole (e.g., the through-hole 583a in FIG. 8), a cover member 585 disposed beneath the second waterproof member, an extension part 5311a disposed beneath the cover member, and the adhesive member 586 disposed beneath the extension part may be disposed to have a step in order to uniformly apply the third waterproof member 583. For example, when the rear surface of the display 500 is seen from above through the through-hole (e.g., the through-hole 583a in FIG. 8), edges of the second waterproof member 582, the cover member 585, the extension part 5311a, and the adhesive member 586 may be disposed to be at least partially visually viewed. According to an embodiment, the cover member 585 laminated on the extension part 5311a may include a conductive layer 5851 and a nonconductive layer 5852 laminated so as to at least partially cover the conductive layer 5851. According to an embodiment, at least a part of the cover member 585 may include an exposed region 5805, in which the conductive layer 5851 is exposed, through omission of the nonconductive layer 5852. For example, the lamination structure of the cover member 585 and the manner in which the conductive layer 5851 is exposed may be substantially identical to the configuration in FIGS. 5C and 5D. In this case, after the needle (e.g., the needle 610 in FIG. 6B) enters the through-hole (e.g., the through-hole 583a in FIG. 8), the adhesive member 586, the extension part 5311a, the cover member 585, and the second waterproof member 582, which are viewed through the through-hole (e.g., the through-hole 583a in FIG. 8), may be connected to each other through the first waterproof member 581 and the third waterproof member 583 injected from the needle (e.g., the needle 610 in FIG. 6B). In operation, when the needle (e.g., the needle 610 in FIG. 6B) made of a conductive material is excessively inserted into the through-hole (e.g., the through-hole 583a in FIG. 8), the conductive layer 5851 of the cover member 585, which is disposed relatively closer to the needle (e.g., the needle 610 in FIG. 6B) (higher) than the extension part 5311a of the display panel 531, is first brought into contact with the needle, thereby stopping operation of the needle (e.g., the needle 610 in FIG. 6B). As a result, the operation of detection of the needle (e.g., the needle 610 in FIG. 6B) through the conductive layer 5851 can reduce additional extensive damage to the display panels 531 and can improve productivity.

The electricity-conducting structure for needle detection, according to exemplary embodiments of the disclosure, may be applied to a structure of a housing of an electronic device, in which liquid dispensing is needed for bonding or filling. For example, when there is no electricity-conducting structure, the breakage or deformation of a needle may be caused by the excessive movement of the needle during a liquid dispensing operation. Thus, a liquid filling member may not be applied at a preset position, or an actual bonding or filling effect may be negligible due to non-application or reduction of an application weight. Now, exemplary embodiments of the disclosure for solving these problems will be described in detail below.

Figure 11B:
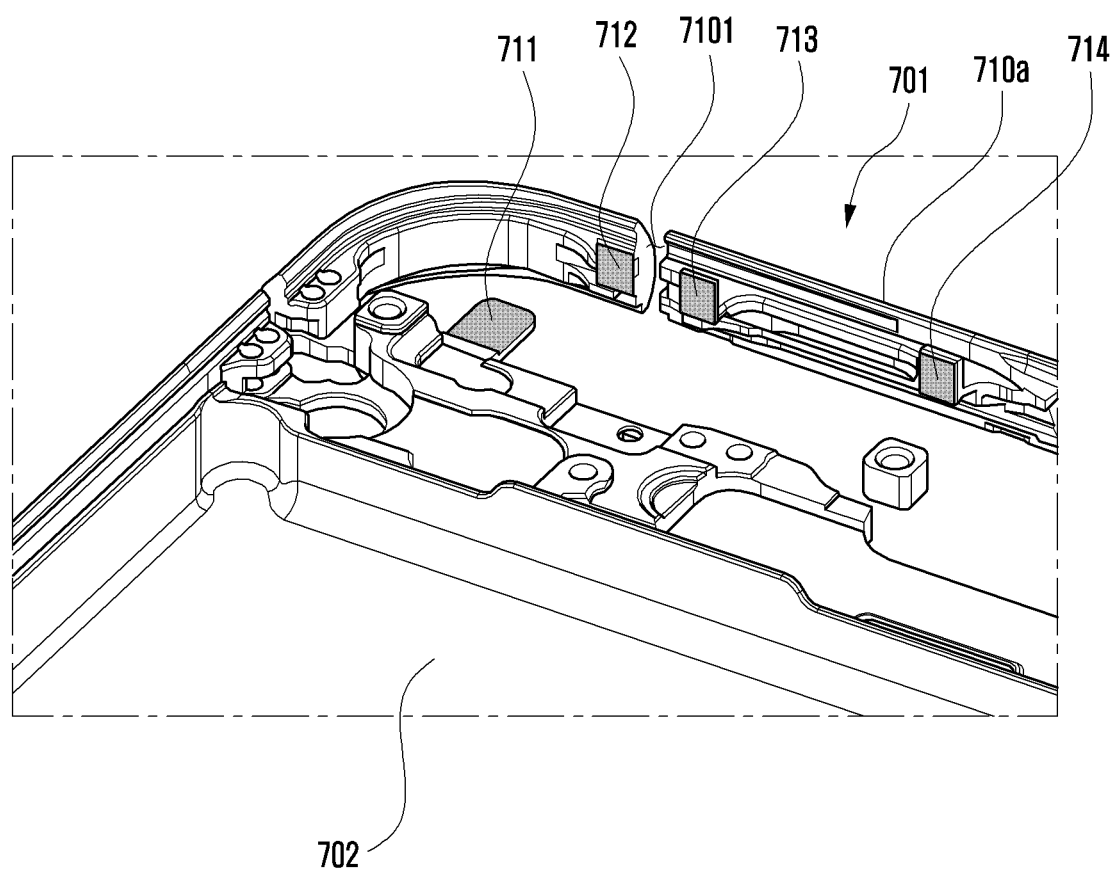
FIG. 11B is a partial perspective of a conductive part of a housing according to certain embodiments of the disclosure.
Figure 11C:
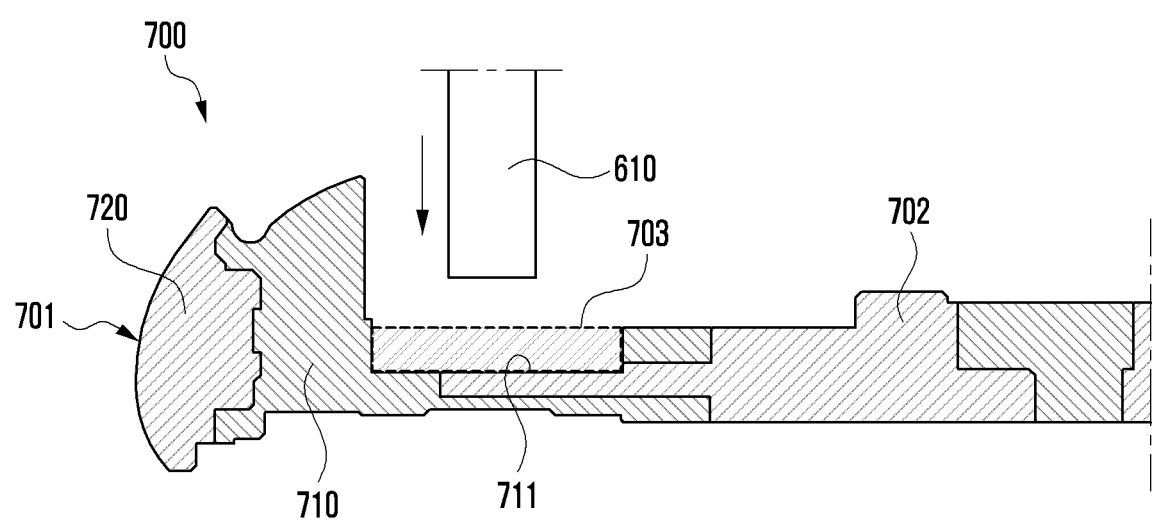
FIG. 11C is a partial cross-sectional view of a housing seen along line 11c-11c in FIG. 11A according to certain embodiments of the disclosure.

FIG. 11A is a perspective view of a housing including an electricity-conducting part according to certain embodiments of the disclosure. FIG. 11B is a partial perspective of a conductive part of a housing according to certain embodiments of the disclosure. FIG. 11C is a partial cross-sectional view of a housing seen along line 11c-11c in FIG. 11A according to certain embodiments of the disclosure.

A housing 700 in FIGS. 11A to 11C may be similar to at least a part of the first housing 110 and/or the second housing 120 in FIG. 1A or at least a part of the housing 310 in FIG. 7A, or may further include other elements of the housing.

Referring to FIGS. 11A to 11C, the housing 700 may include a side member 701 and a support member 702 extending from the side member 701. According to an embodiment, at least a part of the side member 701 may form at least a part of the side surface of an electronic device (e.g., the electronic device 100 in FIG. 1A), and the support member 702 may be formed to extend from the side member 701 into the inner space of the electronic device (e.g., the electronic device 100 in FIG. 1A).

According to certain embodiments, the housing 700 may include a conductive part 710 (e.g., a metal material) and a nonconductive part 720 (e.g., a polymer material) coupled to the conductive part 710. According to an embodiment, the conductive part 710 and the nonconductive part 720 may be coupled to each other through injection, or may be arranged as separate structures and coupled to each other through a structural shape.

According to certain embodiments, the housing 700 may include at least one electricity-conducting part extending from the conductive part 710 and is viewed to be spaced apart from a surrounding conductive part when seen from the outside through the nonconductive part 720. According to an embodiment, the at least one electricity-conducting part may include connection electricity-conducting parts 712, 713, and 714 disposed to be exposed outside in order to electrically connect the conductive part 710 to a ground of the electronic device (e.g., the electronic device 100 in FIG. 1A) or to electrically connect a unit conductive part 710a, which is segmented by a segmentation part 7101 and is used as an antenna of the electronic device (e.g., the electronic device 100 in FIG. 1A), to a wireless communication circuit of the electronic device (e.g., the electronic device 100 in FIG. 1A). According to an embodiment, the at least one electricity-conducting part may include a needle detection electricity-conducting part 711 formed in at least a part of a liquid-applied region 703 included in a region in which a structure (e.g., an electric structure or a magnet) is disposed in the housing 700. According to an embodiment, the needle detection electricity-conducting part 711 may extend from the conductive part 710. According to an embodiment, the needle detection electricity-conducting part 711 may be disposed in an island manner so as to be surrounded by the nonconductive part 720.

Therefore, when excessive approach of a needle 610 operating for the purpose of bonding or filling is detected by the needle detection electricity-conducting part 711 of the housing 700, the needle detection electricity-conducting part 711 may check deformation of the needle 610 in order to perform re-correction or checking breakage of the needle 610 to replace or reset up the needle 610.

Figure 12:
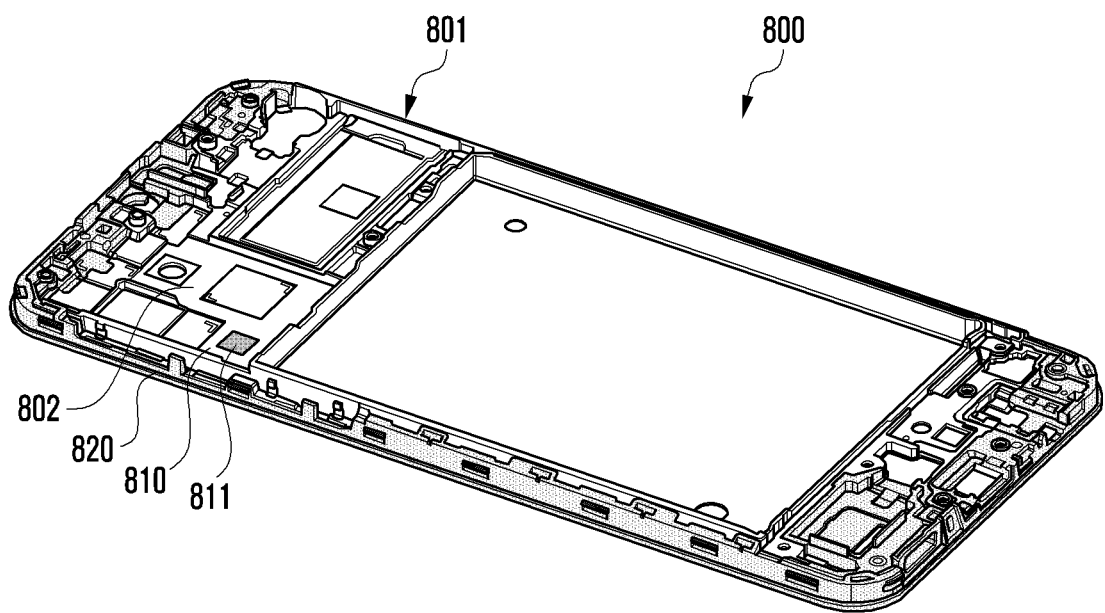
FIGS. 12 and 13 are perspective views of a housing including an electricity-conducting part according to certain embodiments of the disclosure.
Figure 13:
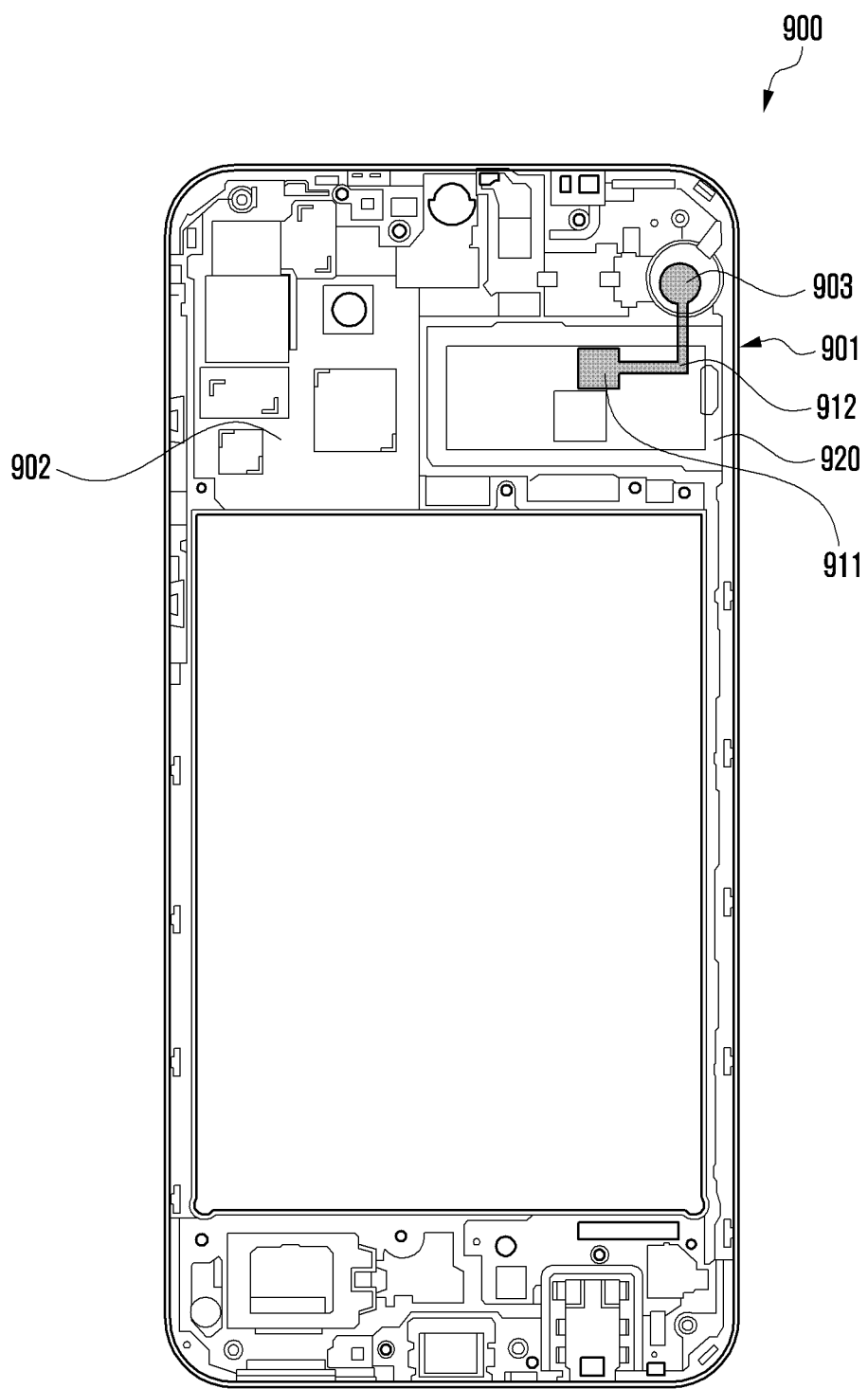

FIGS. 12 and 13 are perspective views of a housing including an electricity-conducting part according to certain embodiments of the disclosure.

Referring to FIG. 12, a housing 800 may include a side member 801 forming at least a part of the side surface of an electronic device (e.g., the electronic device 300 in FIG. 7A) and a support member 802 extending from the side member 801 into the inner space of the electronic device (e.g., the electronic device 300 in FIG. 7A). According to an embodiment, the housing 800 may include a conductive part 810 and a nonconductive part 820 (e.g., a polymer material) coupled to the conductive part 810 (e.g., a metal material). The conductive part 810 may be formed through a nonconductive coated layer (e.g., an anodizing-processed layer) applied to the outer surface thereof for the purpose of aesthetic exterior appearance and corrosion prevention. The housing 800 may include an electricity-conducting part 811 formed by exposing the conductive part 810 through a removal of a nonconductive coated layer of the conductive part 810 in at least a partial region of a region for liquid dispensing. Therefore, when excessive approach of a needle operating for the purpose of bonding or filling is detected through the electricity-conducting part 811 of the housing 800, the electricity-conducting part 811 may serve to check the deformation of the needle in order to perform re-correction or checking breakage of the needle to replace or reset up the needle.

Referring to FIG. 13, a housing 900 may include a side member 901 forming at least a part of the side surface of an electronic device (e.g., the electronic device 300 in FIG. 7A) and a support member 902 extending from the side member 901 into the inner space of the electronic device (e.g., the electronic device 300 in FIG. 7A). According to an embodiment, the housing 900 may be formed of a nonconductive part 920 (e.g., a polymer material). According to an embodiment, the housing 900 may include an electricity-conducting part 903 disposed in at least a partial region of an applied region for liquid dispensing. According to an embodiment, the electricity-conducting part 903, which is a conductive pattern, may be formed in a laser direct structuring pattern (LDS pattern) type at the nonconductive part 920. According to an embodiment, the housing 900 may further include a contact sensing part 911 connected to the electricity-conducting part 903 through a connection part 912 so as to detect contact of a needle device. For example, the connection part 912 and the contact sensing part 911 may also be formed in the housing in the above-described conductive pattern type. In an embodiment, the electricity-conducting part 903, the connection part 912, and the contact sensing part 911 may include conductive plates attached to the housing 900. Therefore, when excessive approach of a needle operating for the purpose of bonding or filling is detected through the electricity-conducting part 903 of the housing 900, the electricity-conducting part 903 may contribute to determining deformation of the needle to perform re-correction or checking breakage of the needle to replace or reset up the needle.

According to certain embodiments, an electronic device (e.g., the electronic device 100 in FIG. 1A) may include a first housing (e.g., the second housing 120 FIG. 1A) including a first support member (e.g., the second support member 1231 in FIG. 3), a second housing (e.g., the first housing 110 in FIG. 1A) including a second support member (e.g., the first support member 113 in FIG. 3) having at least one through-hole (e.g., the through-holes 483a in FIG. 6A), a hinge device (e.g., the hinge device 140 in FIG. 1B) configured to foldably connect the first housing to the second housing, a flexible display (e.g., the flexible display 400 in FIG. 3) disposed to be supported by the second housing via the hinge device from the first housing, the flexible display including a window layer (e.g., the window layer 410 in FIG. 4), a display panel (e.g., the display panel 430 in FIG. 4) disposed beneath the window layer, and a bending part (e.g., the bending part 432 in FIG. 4) extending from the display panel and attached to the rear surface of the display panel, the bending part including an extension part (e.g., the extension part 4321 in FIG. 4), extending outward from the display panel and including a control circuit (e.g., the control circuit 4321*a* in FIG. 4), and a cover member (e.g., the cover member 485 in FIG. 5C), disposed on at least a portion of the extension part so as to cover at least a part of the control circuit and including a conductive layer (e.g., the conductive layer 4851 in FIG. 5C), a first waterproof member (e.g., the first waterproof member 481 in FIG. 3) disposed between the display panel and the first support member so as to surround at least a portion of the bending part, a second waterproof member (e.g., the second waterproof member 482 in FIG. 3) disposed between the bending part and the first support member, and a third waterproof member (e.g., the third waterproof members 483 in FIG. 4) filled through the through-hole such that the first waterproof member is connected to the second waterproof member, wherein the cover member includes an exposed part (e.g., the exposed part 4805 in FIG. 5C) in which at least a part of the conductive layer is exposed, and the exposed part is disposed to at least partially overlap the through-hole.

According to certain embodiments, when the flexible display is seen from above, the control circuit and the flexible substrate may be disposed in a position at least partially overlapping a waterproof space formed by the first waterproof member, the second waterproof member, and the third waterproof member.

According to certain embodiments, the first waterproof member and the second waterproof member may be disposed to be at least partially viewable through the through-hole.

According to certain embodiments, the second waterproof member may be laminated on at least a part of the cover member.

According to certain embodiments, the cover member may include at least one nonconductive layer (e.g., the first layer 4851 or the second layer 4853 in FIG. 5C) laminated on the conductive layer, and the conductive layer may be exposed by partial omission of the at least one nonconductive layer.

According to certain embodiments, the electronic device may further include a flexible substrate (e.g., the flexible substrate 4322 in FIG. 4) electrically connected to the extension part and disposed to overlap at least a part of the cover member, and the conductive layer may be electrically connected, through the flexible substrate, to a ground of a substrate (e.g., the second substrate assembly 162 in FIG. 3) included in the electronic device.

According to certain embodiments, the cover member may further include a shielding layer and/or an adhesive layer, laminated on the conductive layer.

According to certain embodiments, the first support member may include a first support surface (e.g., the first support surface 1131*a* in FIG. 3) facing at least a part of the flexible display and a second support surface (e.g., the second support surface 1131*b* in FIG. 3) facing a direction opposite to a direction faced by the first support surface, the second support member may include a third support surface (e.g., the third support surface 1231*a* in FIG. 3) facing at least a part of the flexible display and a fourth support surface (e.g., the fourth support surface 1231*b* in FIG. 3) facing a direction opposite to a direction faced by the third support surface, and the through-hole may be formed from the third support surface to the fourth support surface.

According to certain embodiments, the third waterproof member may be disposed by being injected through the through-hole from the fourth support surface toward the third support surface.

According to certain embodiments, the conductive layer may be disposed closer to the fourth support surface than to the display panel.

According to certain embodiments, the third waterproof member may include cured-in-place gaskets (CIPG) containing a semi-solid or liquid material which is solidified by a natural or external condition.

According to certain embodiments, the first waterproof member and/or the second waterproof member may include at least one among a tape, an adhesive, waterproof dispensing, silicone, waterproof rubber, or urethane.

According to certain embodiments, the electronic device may further include a metal sheet layer disposed beneath the display panel, and the bending part, the first waterproof member, the second waterproof member, or the third waterproof member may be at least partially attached to the metal sheet layer.

According to certain embodiments, the extension part and the flexible substrate may be attached to the rear surface of the display panel through an adhesive member.

According to certain embodiments, the flexible display may be disposed to be supported by at least a part of each of the first support member and the second support member.

According to certain embodiments, an electronic device (e.g., the electronic device 300 in FIG. 8) may include a housing (e.g., the housing 310 FIG. 7A) including a first support member (e.g., the first support member 311 in FIG. 8) having at least one through-hole (e.g., the through-hole 583*a* in FIG. 8), a display (e.g., the display 500 in FIG. 9) disposed to be supported by at least a part of the housing, the display including a window layer (e.g., the window layer 320 in FIG. 9), a display panel (e.g., the display panel 531 in FIG. 9) disposed beneath the window layer, and a bending part (e.g., the bending part 5311 in FIG. 9) extending from the display panel and attached to the rear surface of the display panel, the bending part including an extension part (e.g., the extension part 5311*a* in FIG. 9), extending outward from the display panel and including a control circuit (e.g., the control circuit 5311*c* in FIG. 9), and a cover member (e.g., the cover member 585 in FIG. 10B), disposed on at least a portion of the extension part so as to cover at least a part of the control circuit and including a conductive layer (e.g., the conductive layer 5851 in FIG. 10B), a first waterproof member (e.g., the first waterproof member 581 in FIG. 8) disposed between the display panel and the first support member so as to surround at least a portion of the bending part, a second waterproof member (e.g., the second waterproof member 582 in FIG. 8) disposed between the bending part and the first support member, and a third waterproof member (e.g., the third waterproof members 583 in FIG. 8) filled through the through-hole such that the first waterproof member is connected to the second waterproof member, wherein the cover member includes an exposed part in which at least a part of the conductive layer is exposed, and the exposed part is disposed to at least partially overlap the through-hole.

According to certain embodiments, when the display is seen from above, the control circuit may be disposed in a position at least partially overlapping a waterproof space formed by the first waterproof member, the second waterproof member, and the third waterproof member.

According to certain embodiments, the first waterproof member and the second waterproof member may be disposed to be at least partially viewable through the through-hole.

According to certain embodiments, the cover member may include at least one nonconductive layer laminated on the conductive layer, and the conductive layer may be exposed by partial omission of the at least one nonconductive layer.

According to certain embodiments, the electronic device may further include a flexible substrate (e.g., the flexible substrate 5311b in FIG. 9) electrically connected to the extension part and disposed to overlap at least a part of the cover member, and the conductive layer may be electrically connected, through the flexible substrate, to a ground of a substrate (e.g., the printed circuit board 340 in FIG. 8) included in the electronic device.

Various embodiments disclosed in the specification and the drawings are merely particular examples provided for easily describing the technical matters according to the embodiments of the disclosure and contributing to understanding of embodiments of the disclosure, and do not limit the scope of embodiments of the disclosure. Therefore, it should be construed that all modifications or modified forms capable of being derived from the technical idea of various embodiments of the disclosure in addition to the embodiments disclosed herein are included in the scope of various embodiments of the disclosure.

The invention claimed is:

1. An electronic device comprising:
a first housing including a first support member;
a second housing including a second support member having at least one through-hole;
a hinge device foldably connecting the first housing to the second housing;
a flexible display disposed to be supported by the first housing and the second housing, the flexible display including: a window layer; a display panel disposed beneath the window layer; and a bending part extending from the display panel and attached to a rear surface of the display panel, the bending part having: an extension part extending outward from the display panel and a control circuit; and a cover member disposed on at least a portion of the extension part so as to cover at least a part of the control circuit and including a conductive layer;
a first waterproof member disposed between the display panel and the second support member so as to surround at least a portion of the bending part;
a second waterproof member disposed between the bending part and the second support member; and
a third waterproof member filled through the at least one through-hole such that the first waterproof member is connected to the second waterproof member,
wherein the cover member comprises an exposed part in which at least a part of the conductive layer is exposed, and the exposed part is disposed so as to at least partially overlap the through-hole.

2. The electronic device of claim 1, wherein the control circuit is disposed in a position at least partially overlapping a waterproof space, which is defined by the first waterproof member, the second waterproof member, and the third waterproof member.

3. The electronic device of claim 1, wherein the first waterproof member and the second waterproof member are disposed so as to be at least partially viewable through the through-hole.

4. The electronic device of claim 1, wherein the second waterproof member is laminated on at least a part of the cover member.

5. The electronic device of claim 4, wherein the cover member comprises at least one nonconductive layer laminated on the conductive layer, and
the conductive layer is exposed by a partial omission of the at least one nonconductive layer.

6. The electronic device of claim 1, further comprising
a flexible substrate electrically coupled to the extension part and disposed to overlap at least a part of the cover member,
wherein the conductive layer is electrically connected, through the flexible substrate, to a ground of a substrate included in the electronic device.

7. The electronic device of claim 1, wherein the cover member further comprises a shielding layer and/or an adhesive layer, laminated on the conductive layer.

8. The electronic device of claim 1, wherein the first support member comprises a first support surface facing at least a part of the flexible display, and a second support surface facing a direction opposite to a direction faced by the first support surface, and
the second support member comprises a third support surface facing at least a part of the flexible display, and a fourth support surface facing a direction opposite to a direction faced by the third support surface,
wherein the through-hole is formed from the third support surface to the fourth support surface.

9. The electronic device of claim 8, wherein the third waterproof member is provided by being injected through the through-hole from the fourth support surface toward the third support surface.

10. The electronic device of claim 8, wherein the conductive layer is disposed closer to the fourth support surface than to the display panel.

11. The electronic device of claim 1, wherein the third waterproof member comprises cured-in-place gaskets (CIPG) containing a semi-solid or liquid material which is solidified by a natural or external condition.

12. The electronic device of claim 1, wherein the first waterproof member and/or the second waterproof member comprises at least one among a tape, an adhesive, waterproof dispensing, silicone, waterproof rubber, or urethane.

13. The electronic device of claim 1, further comprising
a metal sheet layer disposed beneath the display panel,
wherein the bending part, the first waterproof member, the second waterproof member, or the third waterproof member is at least partially attached to the metal sheet layer.

14. The electronic device of claim 1, wherein the extension part and the flexible substrate are attached to the rear surface of the display panel through an adhesive member.

15. The electronic device of claim 1, wherein the flexible display is supported by at least a part of each of the first support member and the second support member.

16. An electronic device comprising:
a housing including a first support member having at least one through-hole;
a display supported by at least a part of the housing, the display comprising: a window layer; a display panel disposed beneath the window layer, and a bending part extending from the display panel and attached to a rear surface of the display panel, the bending part comprising: an extension part extending outward from the display panel and including a control circuit; and a cover member disposed on at least a portion of the extension part so as to cover at least a part of the control circuit and including a conductive layer;

a first waterproof member disposed between the display panel and the first support member so as to surround at least a portion of the bending part;

a second waterproof member disposed between the bending part and the first support member; and a third waterproof member filled through the at least one through-hole such that the first waterproof member is connected to the second waterproof member, wherein the cover member comprises an exposed part in which at least a part of the conductive layer is exposed, and the exposed part is disposed so as to at least partially overlap the through-hole.

17. The electronic device of claim 16, wherein the control circuit is disposed in a position at least partially overlapping a waterproof space formed by the first waterproof member, the second waterproof member, and the third waterproof member.

18. The electronic device of claim 16, wherein the first waterproof member and the second waterproof member are disposed to be at least partially viewable through the through-hole.

19. The electronic device of claim 16, wherein the cover member comprises at least one nonconductive layer laminated on the conductive layer, and wherein the conductive layer is exposed by partial omission of the at least one nonconductive layer.

20. The electronic device of claim 16, further comprising a flexible substrate electrically coupled to the extension part and disposed to overlap at least a part of the cover member, wherein the conductive layer is electrically connected, through the flexible substrate, to a ground of a substrate included in the electronic device.

* * * * *